(12) United States Patent
Xu et al.

(10) Patent No.: US 12,161,036 B2
(45) Date of Patent: Dec. 3, 2024

(54) DISPLAY SUBSTRATE COMPRISING POWER LINES ARRANGED BETWEEN COLUMNS OF SUB-PIXELS AND DISPLAY APPARATUS

(71) Applicant: BOE TECHNOLOGY GROUP CO., LTD., Beijing (CN)

(72) Inventors: Pan Xu, Beijing (CN); Yongqian Li, Beijing (CN); Dacheng Zhang, Beijing (CN); Lang Liu, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 487 days.

(21) Appl. No.: 17/610,409

(22) PCT Filed: Nov. 17, 2020

(86) PCT No.: PCT/CN2020/129458
§ 371 (c)(1),
(2) Date: Nov. 10, 2021

(87) PCT Pub. No.: WO2021/115045
PCT Pub. Date: Jun. 17, 2021

(65) Prior Publication Data
US 2022/0208948 A1     Jun. 30, 2022

(30) Foreign Application Priority Data

Dec. 11, 2019  (CN) .......................... 201911269539.6

(51) Int. Cl.
*H10K 59/13* (2023.01)
*H10K 50/824* (2023.01)
*H10K 59/131* (2023.01)

(52) U.S. Cl.
CPC ....... *H10K 59/1315* (2023.02); *H10K 50/824* (2023.02)

(58) Field of Classification Search
CPC .................... H10K 59/1315; H10K 50/824
(Continued)

(56) References Cited

U.S. PATENT DOCUMENTS

2016/0315127 A1  10/2016  Yoon et al.
2017/0125506 A1   5/2017  Kim
(Continued)

FOREIGN PATENT DOCUMENTS

CN        104835451 A       8/2015
CN        104932137 A       9/2015
(Continued)

OTHER PUBLICATIONS

The First Office Action of Priority Application No. CN 201911269539.6 issued by the Chinese Patent Office on Oct. 25, 2021.

*Primary Examiner* — Phuc T Dang
(74) *Attorney, Agent, or Firm* — IP & T GROUP LLP

(57) ABSTRACT

A display substrate has a display area including a plurality of sub-display areas. The display substrate includes a base, a plurality of columns of pixels, a plurality of first and second power lines disposed on the base. At least two columns of pixels are disposed in each sub-display area, and each column of pixels includes at least three columns of sub-pixels. At least one first power line is disposed in each sub-display area and configured to provide a first power signal to all sub-pixels in a sub-display area. The second power lines are configured to provide second power signals to all sub-pixels. A plurality of columns of sub-pixels are disposed between any two adjacent power lines, and any first and second power lines are each arranged between two adjacent columns of sub-pixels emitting light of a first color and sub-pixels emitting light of a second color.

18 Claims, 14 Drawing Sheets

(58) Field of Classification Search
USPC .......................................................... 257/89
See application file for complete search history.

(56) References Cited

U.S. PATENT DOCUMENTS

| | | |
|---|---|---|
| 2017/0132965 A1 | 5/2017 | Hsu |
| 2017/0213850 A1 | 7/2017 | Dong et al. |
| 2020/0286426 A1 | 9/2020 | Li et al. |

FOREIGN PATENT DOCUMENTS

| | | | | |
|---|---|---|---|---|
| CN | 107464831 A | | 12/2017 | |
| CN | 107871772 A | | 4/2018 | |
| CN | 108028264 A | | 5/2018 | |
| CN | 108831302 A | * | 11/2018 | ............... G09F 9/30 |
| CN | 109524441 A | * | 3/2019 | ............. G09F 9/301 |
| CN | 109686312 A | | 4/2019 | |
| CN | 110911468 A | | 3/2020 | |
| KR | 20190013167 A | * | 2/2019 | ........... H10K 59/131 |

\* cited by examiner

DISPLAY SUBSTRATE COMPRISING POWER LINES ARRANGED BETWEEN COLUMNS OF SUB-PIXELS AND DISPLAY APPARATUS

CROSS-REFERENCE TO RELATED APPLICATION

This application is a national phase entry under 35 USC 371 of International Patent Application No. PCT/CN2020/129458, filed on Nov. 17, 2020, which claims priority to Chinese Patent Application No. 201911269539.6, filed on Dec. 11, 2019, which are incorporated herein by reference in their entirety.

TECHNICAL FIELD

The present disclosure relates to the field of display technologies, and in particular, to a display substrate and a display apparatus.

BACKGROUND

Electroluminescent display apparatuses become the mainstream development trend of current display apparatuses due to advantages of self-luminescence, low power consumption, wide viewing angle, fast response speed, high contrast and the like.

SUMMARY

In one aspect, a display substrate is provided. The display substrate has a display area, and the display area includes a plurality of sub-display areas. The display substrate includes a base, a plurality of columns of pixels disposed on the base and located in the display area, a plurality of first power lines and a plurality of second power lines that are disposed on the base. At least two columns of pixels in the plurality of columns of pixels are disposed in each sub-display area, and each column of pixels includes at least three columns of sub-pixels. Each sub-display area is provided with at least one first power line of the plurality of first power lines, the at least one first power line is configured to provide a first power signal to all sub-pixels in a sub-display area where the at least one first power line is located. Extension directions of the plurality of second power lines and the plurality of first power lines are the same as an arrangement direction of a plurality of sub-pixels in a column of sub-pixels. The plurality of second power lines are configured to provide second power signals to all sub-pixels located in the display area. A plurality of columns of sub-pixels are disposed between any two adjacent power lines among the plurality of first power lines and the plurality of second power lines, and any first power line and any second power line are each arranged between a column of sub-pixels for emitting light of a first color and a column of sub-pixels for emitting light of a second color adjacent thereto.

In some embodiments, each sub-display area is provided with one first power line.

In some examples, any column of sub-pixels for emitting light of the first color and a column of sub-pixels 100 for emitting light of the second color adjacent thereto are provided with one first power line or one second power line therebetween.

In some embodiments, a number of columns of the at least two columns of pixels in each display sub-area is the same.

In some embodiments, a number of columns of pixels between any two adjacent first power lines is the same.

In some embodiments, the plurality of first power lines and the plurality of second power lines are disposed in the same layer.

In some embodiments, each sub-pixel includes a light-emitting device. The light-emitting device includes a first electrode, a light-emitting functional layer and a second electrode that are sequentially stacked in a thickness direction of the base, and the second electrode is electrically connected to at least one second power line.

In some embodiments, second electrodes of light-emitting devices of all sub-pixels are connected as an integral structure. the plurality of second power lines are all electrically connected to the integral structure.

In some embodiments, each sub-pixel further includes a pixel circuit. The pixel circuit is electrically connected to a first electrode of a light-emitting device in the sub-pixel and at least one first power line in a sub-display area where the pixel circuit is located, and the pixel circuit is configured to drive the corresponding light-emitting device to emit light.

In some embodiments, the display substrate further includes a plurality of data lines disposed on the base and located in the display area. Pixel circuits located in the same column of sub-pixels are connected to a corresponding data line. The plurality of data lines, the plurality of first power lines and the plurality of second power lines have the same extension direction and are disposed in the same layer.

In some embodiments, a resistance of a first power line is equal to 0.9 to 1.1 times a resistance of a second power line.

In some embodiments, a resistance of the second power line and a portion, overlapping with the second power line in the thickness direction of the base, of the second electrode after being connected in parallel is equal to 0.9 to 1.1 times a resistance of a first power line.

In some embodiments, a line width of a first power line is greater than or equal to a line width of a second power line.

In some embodiments, the first power line includes a first portion and a second portion. The second power line includes a third portion and a fourth portion. The first portion and the third portion are each located between pixel openings of two adjacent sub-pixels, and a difference between a line width of the first portion and a line width of the third portion is in a range of 0 μm to 1 μm.

In some embodiments, a first power line is a voltage drain drain (VDD) power line, and a second power line is a voltage source source (VSS) power line.

In some embodiments, each column of pixels includes a column of sub-pixels for emitting red light, a column of sub-pixels for emitting green light and a column of sub-pixels for emitting blue light. The light of the first color and the light of the second color are two of the red light, the green light and the blue light.

In some other embodiments, each column of pixels includes a column of sub-pixels for emitting red light, a column of sub-pixels for emitting green light, a column of sub-pixels for emitting blue light and a column of sub-pixels for emitting white light. the light of the first color and the light of the second color are two of the red light, the green light, the blue light and the white light.

In another aspect, a display apparatus including the above display substrate is provided.

BRIEF DESCRIPTION OF THE DRAWINGS

In order to describe technical solutions in the present disclosure more clearly, the accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings in the following description may be regarded as schematic diagrams, and are not limitations on actual sizes of products involved in the embodiments of the present disclosure.

DETAILED DESCRIPTION

Figure 1:
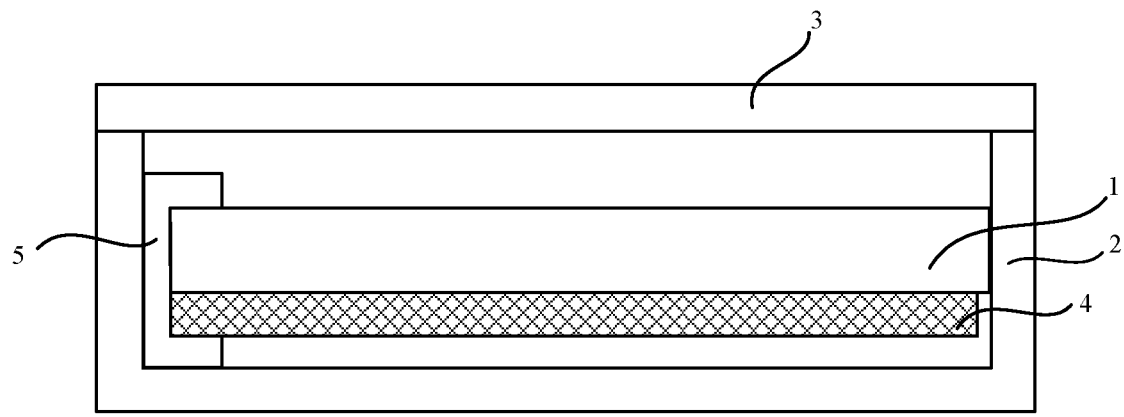
FIG. 1 is a schematic diagram showing a structure of a display apparatus, in accordance with some embodiments of the present disclosure.

Technical solutions in some embodiments of the present disclosure will be described clearly and completely below with reference to the accompanying drawings. Obviously, the described embodiments are merely some but not all embodiments of the present disclosure. All other embodiments made on the basis of the embodiments of the present disclosure by a person of ordinary skill in the art shall be included in the protection scope of the present disclosure.

Unless the context requires otherwise, throughout the specification and the claims, the term "comprise" and other forms thereof such as the third-person singular form "comprises" and the present participle form "comprising" are construed as an open and inclusive meaning, i.e., "including, but not limited to." In the description of the specification, terms such as "some embodiments," "example," "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

Below, the terms "first" and "second" are only used for descriptive purposes, and are not to be construed as indicating or implying relative importance or implicitly indicating the number of indicated technical features. Thus, a feature defined with "first" or "second" may explicitly or implicitly include one or more of the features. In the description of the embodiments of the present disclosure, the term "a plurality of/the plurality of" means two or more unless otherwise specified.

In the description of some embodiments, the term "connected" and its extensions may be used. For example, the term "connected" may be used in the description of some embodiments to indicate that two or more components are in direct or indirect electrically contact with each other. The embodiments disclosed herein are not necessarily limited to the contents herein.

The expression "A and/or B" includes the following three combinations: only A, only B, and a combination of A and B.

As used herein, depending on the context, the term "if" is optionally construed as "when" or "in a case where".

The expression such as "configured to" means an open and inclusive language, which does not exclude devices that are configured to perform additional tasks or steps.

In addition, the use of the phrase "based on" is meant to be open and inclusive, since a process, step, calculation or other action that is "based on" one or more of the stated conditions may, in practice, be based on additional conditions.

The term such as "about" or "approximately" as used herein includes a stated value and an average value within an acceptable range of deviation of a particular value. The acceptable range of deviation is determined by a person of ordinary skill in the art in view of the measurement in question and the error associated with the measurement of a particular quantity (i.e., the limitations of the measurement system).

Exemplary embodiments are described herein with reference to cross-sectional views and/or plan views as idealized exemplary drawings. In the accompanying drawings, thickness of layers and regions are enlarged for clarity. Therefore, the exemplary embodiments should not be construed as being limited to the shapes of the regions shown herein, but including shape deviations due to, for example, manufacturing. The regions shown in the accompanying drawings are schematic in nature, and their shapes are not intended to show actual shapes of the regions in a device, and are not intended to limit the scope of the exemplary embodiments.

Some embodiments of the present disclosure provide a display apparatus. In order to facilitate understanding of the embodiments of the present disclosure, the structure of the display apparatus will be exemplarily described below. However, the exemplary description below cannot be understood as limitations on the structure of the display apparatus provided by the embodiments of the present disclosure, and other variations of the structure of the display apparatus provided by the embodiments of the present disclosure may also be possible.

The display apparatus provided in some embodiments of the present disclosure is a self-luminous display apparatus. For example, the display apparatus may be an organic light-emitting diode (OLED) display apparatus or a quantum dot light-emitting diode (QLED) display apparatus. In a case where the display apparatus is an OLED display apparatus, a display panel of the display apparatus is an organic light-emitting display panel. In a case where the display apparatus is an QLED display apparatus, a display panel of the display apparatus is a quantum dot light-emitting diode display panel.

The display apparatus may serve as any product or component with a display function, such as a mobile phone, a television (TV), a computer, a tablet computer, a vehicle-mounted display, a personal digital assistant (PDA) or a navigator, which is not limited in the embodiments of the present disclosure.

In some embodiments, as shown in FIG. 1, the display apparatus includes a display panel 1, a frame 2, a cover plate 3, a circuit board 4, a flexible printed circuit (FPC) 5 and the like. The display apparatus may include more or fewer components, and relative positions of these components may be changed.

For example, a section of the frame 2 is U-shaped. The display panel 1, the circuit board 4 and the flexible printed circuit 5 are disposed in a cavity enclosed by the frame 2 and the cover plate 3. An end of the flexible printed circuit 5 is bonded to an edge of the display panel 1, and the other end of the flexible printed circuit 5 is bonded to the circuit board 4. The circuit board 4 is disposed on a side of the display panel 1 away from the cover plate 3.

In some examples, the flexible circuit board 5 includes a flexible circuit board body and at least one driver chip disposed on the flexible circuit board body. The driver chip may be a driver integrate circuit (IC). For example, the at least one driver chip includes at least one data driver IC.

In some examples, the circuit board 4 is configured to provide the display panel 1 with signals required for display. For example, the circuit board 4 is a printed circuit board assembly (PCBA) that includes a printed circuit board (PCB) and a timing controller (TCON) disposed on the PCB, a power management IC (PMIC), and other ICs or circuits.

Figure 2:
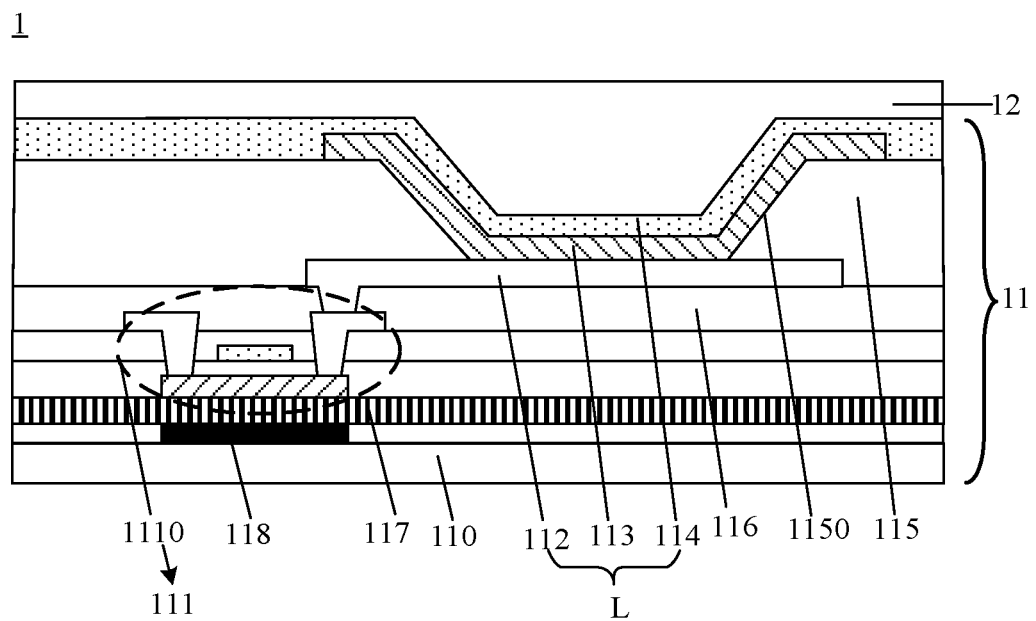
FIG. 2 is a schematic diagram showing a structure of a display substrate, in accordance with some embodiments of the present disclosure.
Figure 3:
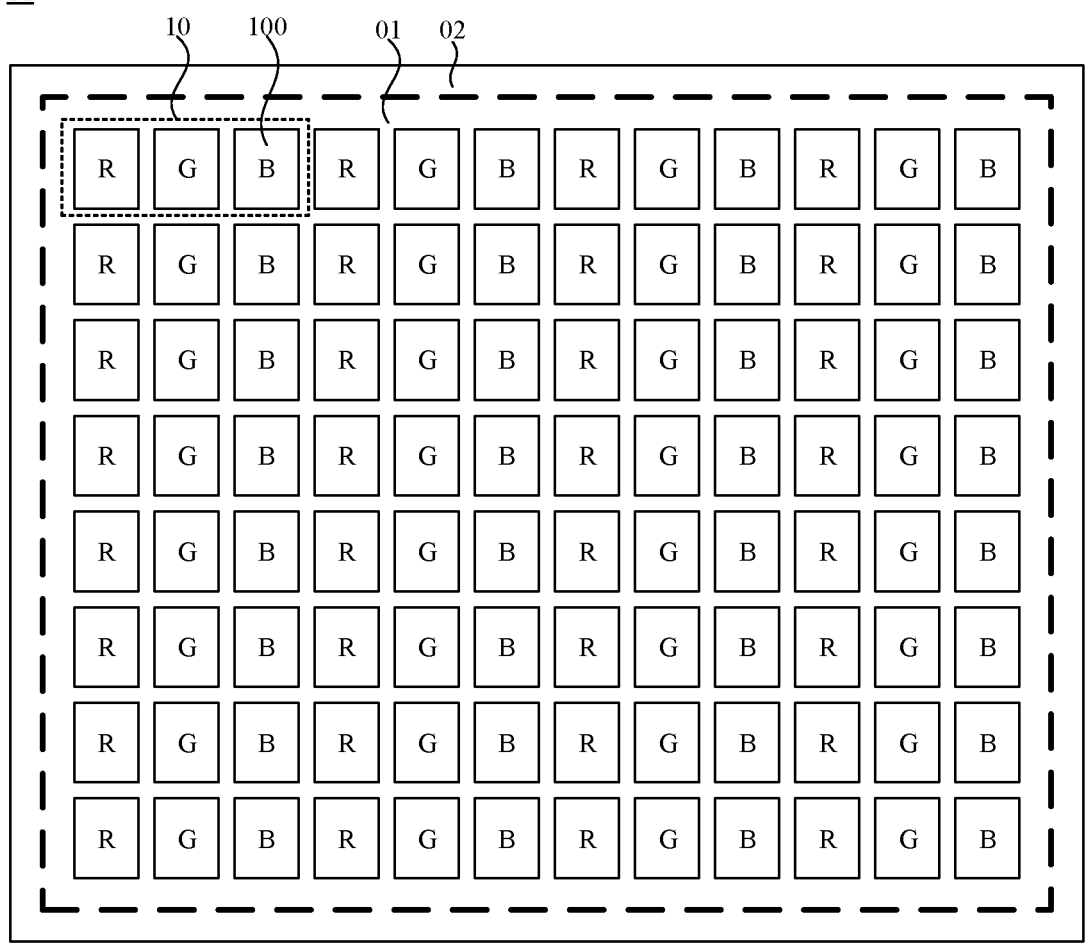
FIG. 3 is a schematic diagram of a display area of a display substrate, in accordance with some embodiments of the present disclosure.

In some embodiments, as shown in FIG. 2, the display panel includes a display substrate 11 and an encapsulation layer 12. The encapsulation layer 12 is configured to encapsulate the display substrate 11. For example, the encapsulation layer 12 is a flexible encapsulation film. As another example, the encapsulation layer 12 is a rigid encapsulation substrate.

Some embodiments of the present disclosure provide a display substrate 11. As shown in FIGS. 3 and 5 to 11, the display substrate 11 has a display area 01. In some embodiments, as shown in FIGS. 3 and 5 to 11, the display substrate 11 further has a peripheral area 02. In some examples, the peripheral area 02 is disposed around the display area 01. In some other examples, the peripheral area 02 is located on only one side of the display area 01. In yet some other examples, the peripheral area 02 is located on two opposite sides of the display area 01. The peripheral area 02 is used for wiring, and in addition, a driving circuit (e.g., a gate driver circuit) may also be disposed in the peripheral area 02. FIG. 3 and FIGS. 5 to 11 all show examples in which the peripheral area 02 is disposed around the display area 01.

As shown in FIGS. 5 to 11, the display area 01 includes a plurality of sub-display areas 20. As shown in FIGS. 5 to 11, the display substrate 11 includes a base 110, a plurality of columns of pixels 10 disposed on the base 110 and located in the display area 01, and a plurality of first power lines 30 and a plurality of second power lines 40 disposed on the base 110. A portion of each of the plurality of first power lines 30 and the plurality of second power lines 40 is located in the display area 01. At least two columns of pixels 10 of the plurality of columns of pixels 10 are disposed in each sub-display area 20, and each column of pixels 10 includes at least three columns of sub-pixels 100. The three columns of sub-pixels 100 are configured to emit light of three primary colors (for example, one column of sub-pixels 100 are configured to emit light of a first color, another column of sub-pixels 100 are configured to emit light of a second color, and yet another column of sub-pixels 100 are configured to emit light of a third color, the light of the first color, the second color and the third color being three primary colors). Extension directions of the plurality of first power lines 30 and the plurality of second power lines 40 are the same as an arrangement direction of a plurality of sub-pixels 100 in a column of sub-pixels 100. Each sub-display area 20 is provided with at least one first power line 30 of the plurality of first power lines 30. The at least one first power line 30 is configured to provide a first power signal to all sub-pixels 100 in the sub-display area 20 where the at least one first power line 30 is located. The plurality of second power lines 40 are configured to provide a second power signal to all sub-pixels located in the display area 01. A plurality of columns of sub-pixels 100 are provided between any two adjacent power lines among the plurality of first power lines 30 and the plurality of second power lines 40, and any first power line 30 and any second power line 40 are each arranged between a column of sub-pixels 100 for emitting light of the first color and a column of sub-pixels 100 for emitting light of the second color adjacent thereto.

In some embodiments, the plurality of first power lines 30 and the plurality of second power lines 40 are disposed in the same layer. Based on this, the plurality of first power lines 30 and the plurality of second power lines 40 may be manufactured through the same patterning process.

In the display substrate 11 provided by some embodiments of the present disclosure, since the first power lines 30 and the second power lines 40 may be disposed in the same layer, the first power lines 30 and the second power lines may be manufactured through the same patterning process, which is beneficial to simplifying the manufacturing processes of the display substrate 11.

The "same layer" herein refers to a layer structure formed through the same patterning process in which a film layer for forming a specific pattern is formed by using a same film-forming process. Depending on different specific patterns, the same patterning process may include exposure, development and etching, and the specific pattern formed in the layer structure may be continuous or discontinuous.

In some examples, a material of the first power line 30 is the same as a material of the second power line 40, and a thickness of the first power line 30 is the same as a thickness of the second power line 40.

For example, the first power signal and the second power signal are both direct current voltage signals. In some examples, the first power signal is a direct current high voltage signal, and the second power signal is a direct current low voltage signal. Herein, "high voltage" and "low voltage" are relative concepts, and one with a higher voltage is referred to as a high voltage, and one with a lower voltage is referred to as a low voltage.

In some embodiments, a plurality of pixels 10 in each column of pixels 10 are arranged in a first direction, and the plurality of columns of pixels 10 are arranged in a second direction. The first direction intersects with the second direction (e.g., vertically). Based on this, the at least three columns of sub-pixels 100 in each column of pixels 10 are arranged in the second direction, and a plurality of sub-pixels 100 in each column of sub-pixels 100 are arranged in the first direction. The plurality of second power lines 40 and the plurality of first power lines 30 each extend in the first direction.

In some examples, the plurality of pixels 10 in each column of pixels 10 are arranged in an extension direction of an edge of the display area 01 (that is, the extension direction of the edge is the first direction), and the plurality of columns of pixels 10 are arranged in an extension direction of another edge of the display area 01 (that is, the extension direction of the another edge is the second direction). An example is taken in which the plurality of pixels 10 in each column of pixels 10 are arranged in a vertical direction, and the plurality of columns of pixels 10 are arranged in a horizontal direction. The plurality of second power lines 40 and the plurality of first power lines 30 each extend in the vertical direction. Each column of pixels 10 includes the at least three columns of sub-pixels 100 arranged in the horizontal direction.

In some embodiments, as shown in FIGS. 3 and 5 to 11, each column of pixels 10 includes three columns of sub-pixels 100, which are a column of sub-pixels R for emitting red light, a column of sub-pixels G for emitting green light, and a column of sub-pixels B for emitting blue light. Based on this, the light of the first color and the second color are two of the red light, the green light and the blue light.

In some other embodiments, each column of pixels 10 includes four columns of sub-pixels 100, which are a column of sub-pixels R for emitting red light, a column of sub-pixels G for emitting green light, a column of sub-pixels B for emitting blue light, and a column of sub-pixels for emitting white light. Based on this, the light of the first color and the second color are two of the red light, the green light, the blue light and the white light.

An example is taken in which each column of pixels 10 includes a column of sub-pixels R, a column of sub-pixels G and a column of sub-pixels B for description below.

Figure 12:
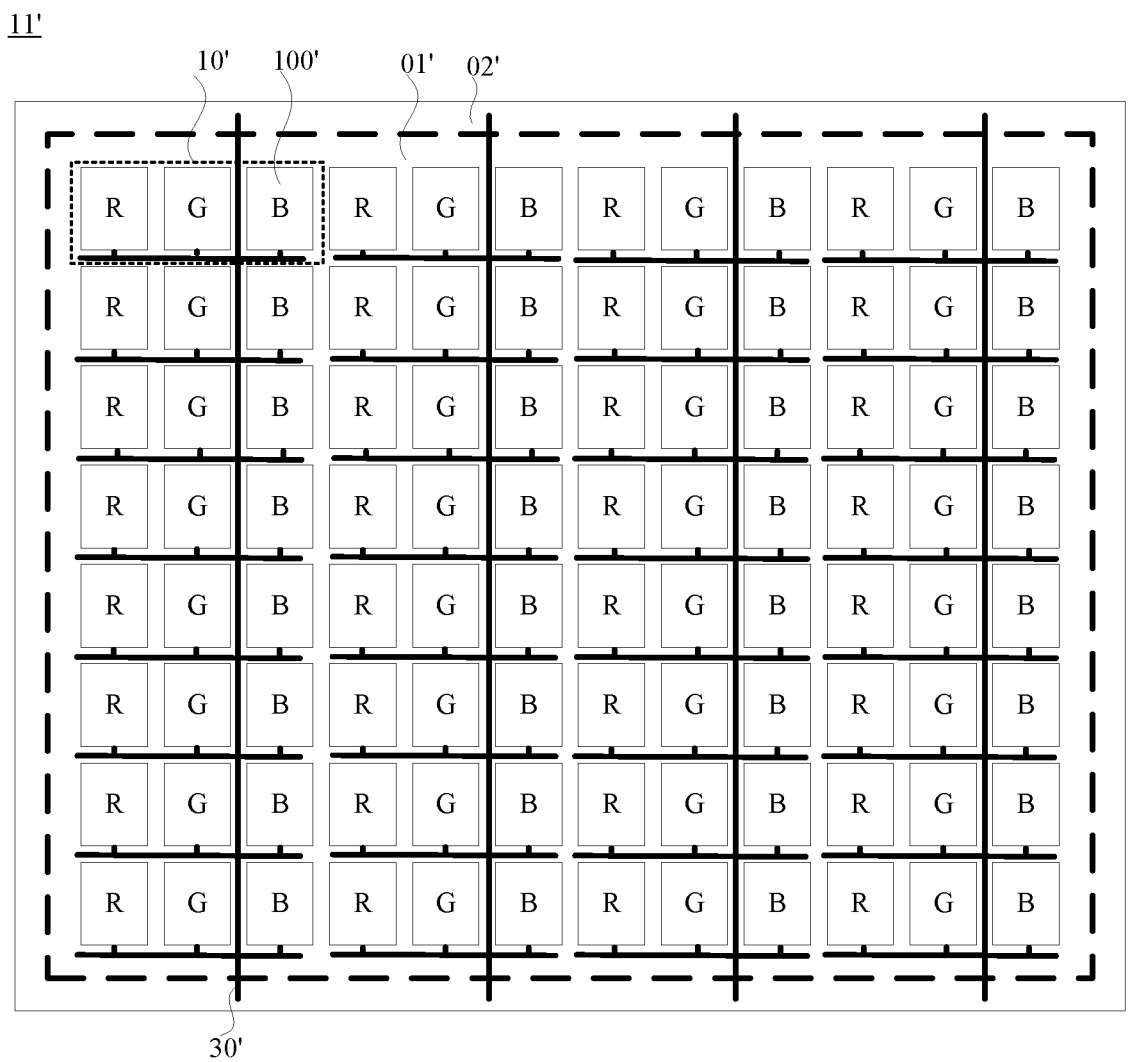
FIG. 12 is a schematic diagram showing a structure of a display substrate in the related art.
Figure 13:
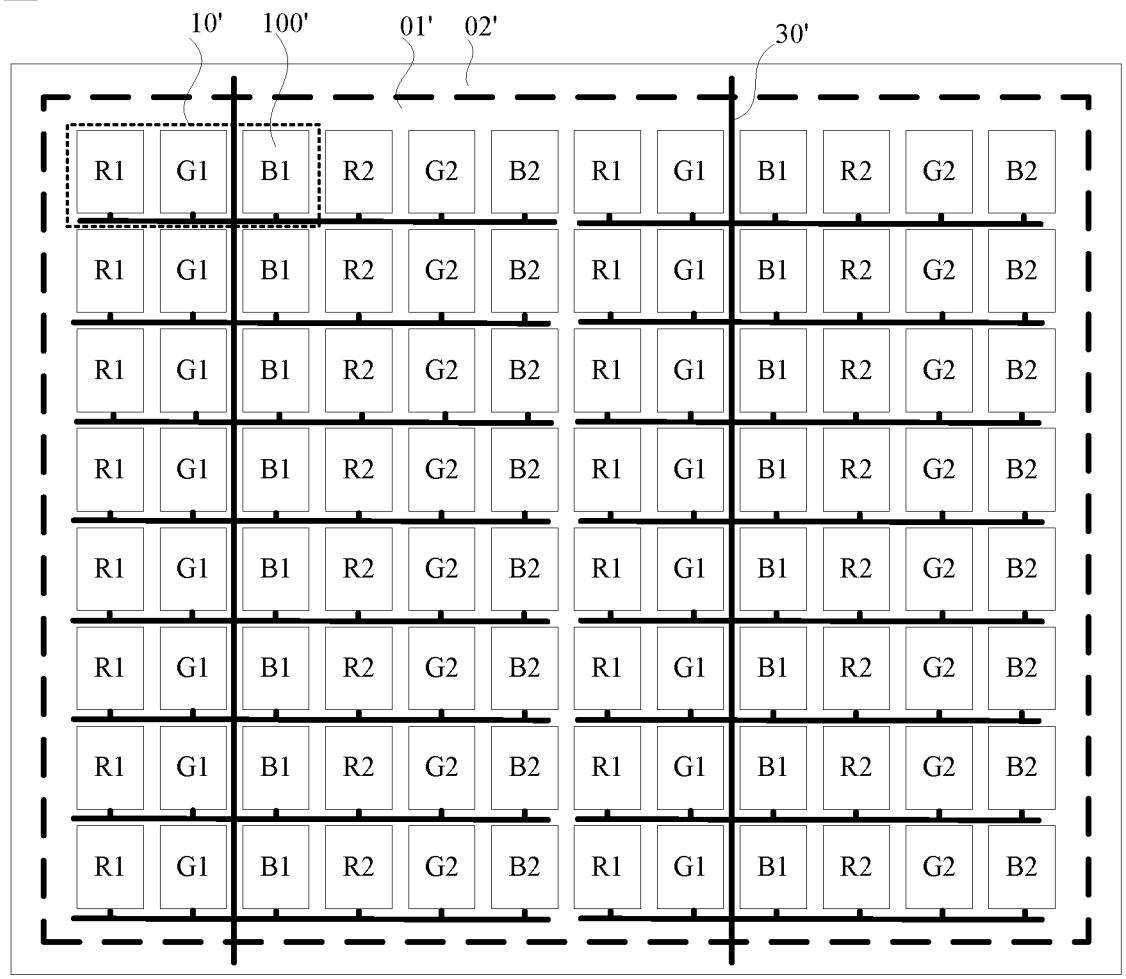
FIG. 13 is a schematic diagram showing a structure of another display substrate in the related art.

In the related art, as shown in FIGS. 12 and 13, a display substrate 11' includes a plurality of columns of pixels 10', and each column of pixels 10' includes at least three columns of sub-pixels 100'. The display substrate 11' further includes a plurality of first power lines 30'. As shown in FIG. 12, all sub-pixels 100' in each column of pixels 10' are electrically connected to a corresponding first power line 30'. Since each column of pixels 10' corresponds to one first power line 30', the number of first power lines 30' will be great, which in turn results in a need to provide more integrated circuits (ICs) to supply signals to all first power lines 30'.

In order to reduce the number of first power lines 30', as shown in FIG. 13, all sub-pixels 100' in every two columns of pixels 10' may be electrically connected to a corresponding first power line 30'. In this way, the number of first power lines 30' may be reduced.

However, since the signal of the first power line 30' is a direct current signal, the first power line 30' is equivalent to a resistor. Therefore, the first power line 30' will generate heat when current flowing therethrough, and the heat generated will affect light-emitting performance of sub-pixels 100' at both sides of the first power line 30'.

Since all sub-pixels 100' in every two columns of pixels 10' are electrically connected to a corresponding first power line 30', the first power line 30' has an influence on the light emitted from the sub-pixels 100' at both sides of the first power line 30' in one column of pixels 10', but has no influence on the light emitted from sub-pixels 100' in the other column of pixels 10' which for emitting light of the same color as the sub-pixels 100' at both sides of the first power line 30'. As a result, in a case where the same signal is applied to sub-pixels 100' for emitting light of the same color, there is a difference among the lights from the sub-pixels 100' for emitting light of the same color, thereby affecting the uniformity of the display, and resulting in a poor display effect. For example, referring to FIG. 13, the heat generated by the first power line 30' will affect the green light emitted by a column of sub-pixels G1 and the blue light emitted by a column of sub-pixels B1 in one column of pixels 10', but will not affect the green light emitted by a column of sub-pixels G2 and the blue light emitted by a column of sub-pixels B2 in the other column of pixels 10'. Therefore, in a case where the same signal is applied to the sub-pixels G1 and the sub-pixels G2, there is a difference among the lights emitted by the sub-pixels G1 and sub-pixels G2, and in a case where the same signal is applied to the sub-pixels B1 and the sub-pixels B2, there is a difference among the lights emitted by the sub-pixels B1 and the sub-pixels B2, thereby affecting the uniformity of the display.

In the display substrate 11 provided by some embodiments of the present disclosure, each first power line 30 is arranged between a column of sub-pixels 100 for emitting the light of the first color and a column of sub-pixels 100 for emitting the light of the second color adjacent thereto, and each second power line 40 is arranged between another column of sub-pixels 100 for emitting the light of the first color and a column of sub-pixels 100 for emitting the light of the second color adjacent thereto, so that in adjacent two columns of sub-pixels 100, the sub-pixels 100 for emitting the light of the first color and the adjacent sub-pixels for emitting the light of the second color are affected by either heat generated from the first power line 30 or heat generated from the second power line 40. In this way, in a case where the same signal is applied to the sub-pixels for emitting the light of the same color, there may be no difference among the lights emitted by the sub-pixels 100 for emitting the light of the same color, which resolves a problem that there is a difference among the lights from the sub-pixels for emitting light of the same color which caused by reducing the number of first power lines 30, thereby improving the uniformity of the display, and the display effect is good.

Figure 5:
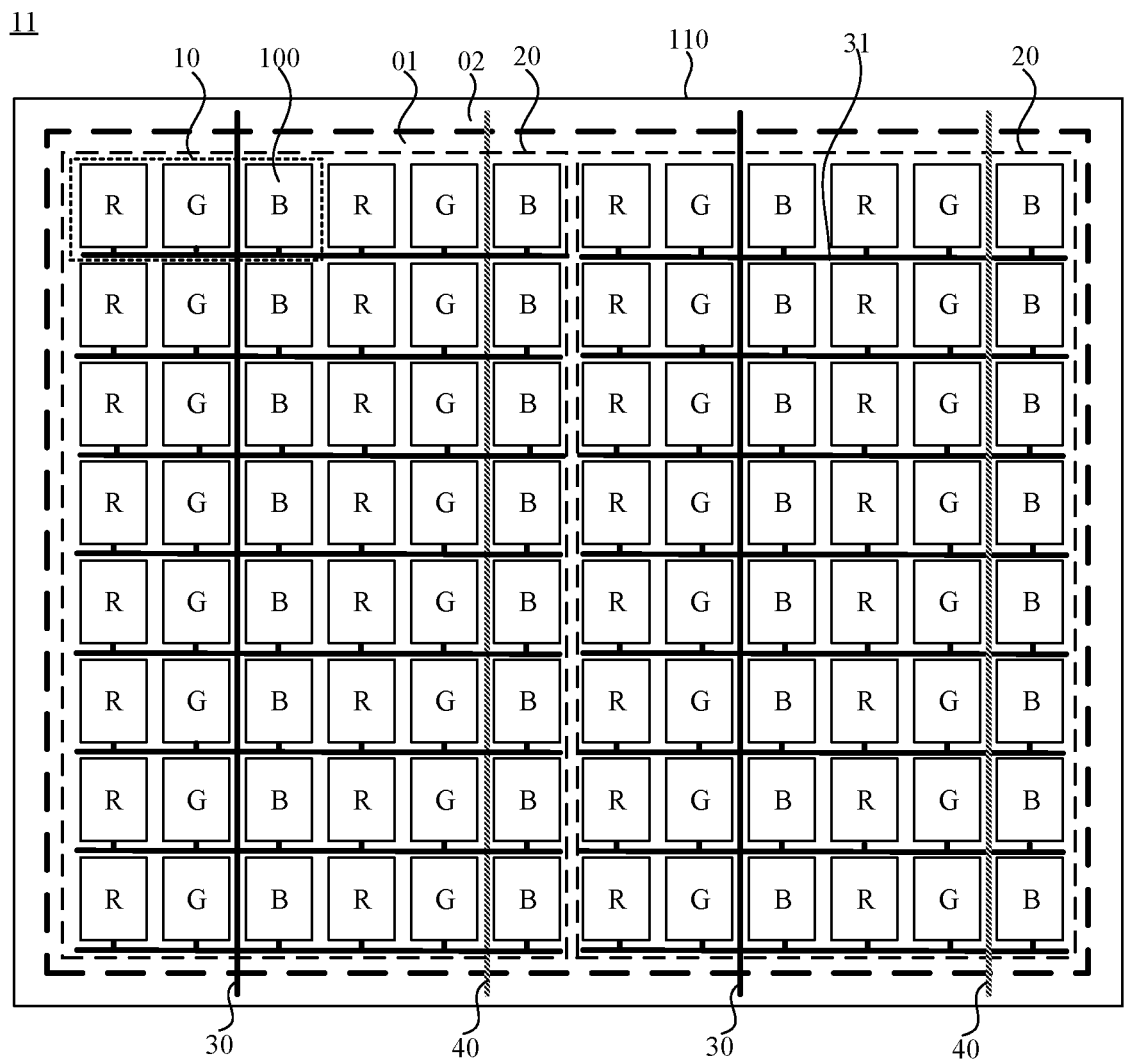
FIG. 5 is a schematic diagram showing a structure of a display substrate, in accordance with some embodiments of the present disclosure.

For example, referring to FIG. 5, the sub-display area 20 is provided with two columns of pixels 10, and a first power line 30 is arranged between a column of sub-pixels G for emitting green light and a column of sub-pixels B for emitting blue light in a column of pixels 10, and a second power line 40 is arranged between a column of sub-pixels G for emitting green light and a column of sub-pixels B for emitting blue light in the other column of pixels 10. In this way, the heat generated by the first power line 30 affects the green light emitted by the sub-pixels G and the blue light emitted by the sub-pixels B located at both sides of the first power line 30, and the heat generated by the second power line 40 affects the green light emitted by the sub-pixels G and the blue light emitted by the sub-pixels B located at both sides of the second power line 40, so that there is no difference among the lights emitted by the sub-pixels 100 for emitting light of the same color in the two columns of pixels 10.

It will be noted that, the sub-pixels 100 located at both sides of the first power line 30 refer to sub-pixels 100 located at both sides of the first power line 30 and closest to the first power line 30. It will be noted that, the sub-pixels 100 located at both sides of the second power line 40 refer to sub-pixels 100 located at both sides of the second power line 40 and closest to the second power line 40. For example, as shown in FIG. 5, the sub-pixels 100 located at both sides of the first power line 30 are sub-pixels G and sub-pixels B, and the sub-pixels 100 located at both sides of the second power line 40 are sub-pixels G and sub-pixels B.

In some embodiments, as shown in FIG. 2, each sub-pixel 100 includes a light-emitting device L. The light-emitting device L includes a first electrode 112, a light-emitting functional layer 113 and a second electrode 114 that are sequentially stacked in a thickness direction of the base 110.

The second electrode 114 is electrically connected to at least one second power line 40.

In some examples, the first electrode 112 is an anode, and the second electrode 114 is a cathode. In some other examples, the first electrode 112 is a cathode, and the second electrode 114 is an anode.

In some examples, second electrodes 114 of all light-emitting devices L are connected as an integral structure. The plurality of second power lines 40 are all electrically connected to the integral structure. For example, the second electrodes 114 of all light-emitting devices L are formed into an integral structure by an evaporation method.

In some examples, the light-emitting function layer 113 includes a light-emitting layer (EL). In some other examples, in addition to the light-emitting layer, the light-emitting functional layer 113 further includes one or more of an electron transport layer (ETL), an electron injection layer (EIL), a hole transport layer (HTL) and a hole injection layer (HIL). An example is taken in which the first electrode 112 is the anode and the second electrode 114 is the cathode, the electron transport layer and the electron injection layer are disposed between the light-emitting layer and the second electrode 114, and the electron transport layer is disposed between the electron injection layer and the light-emitting layer; the hole transport layer and the hole injection layer are disposed between the first electrode 112 and the light-emitting layer, and the hole transport layer is disposed between the hole injection layer and the light-emitting layer.

In some embodiments, as shown in FIG. 2, the display substrate 11 further includes a pixel defining layer 115 disposed above the base 110. The pixel defining layer 115 has a plurality of openings 1150. At least the light-emitting layer of the light-emitting device L is disposed in one opening in the pixel defining layer 115.

In some examples, orthogonal projections of the electron transport layer, the electron transport layer, the hole transport layer, and the hole injection layer of the light-emitting device L on the base 110 are all located in a range of an orthogonal projection of one opening 1150 in the pixel defining layer 115 on the base 110. In this case, for example, the light-emitting layer, the electron transport layer, the electron transport layer, the hole transport layer, and the hole injection layer of the light-emitting device L are all located in one opening 1150 in the pixel defining layer 115. In some other examples, in the display area 01, electron transport layers of all light-emitting devices are connected as a whole, electron transport layers of all light-emitting devices are connected as a whole, hole transport layers of all light-emitting devices are connected as a whole, and hole injection layers of all light-emitting devices are connected as a whole.

The embodiments of the present disclosure do not limit the method of forming each layer in the light-emitting function layer 113. For example, each layer in the light-emitting function layer 113 is formed by a printing method or an evaporation method. For example, all layers in the light-emitting function layer 113 are formed by a printing method, and each layer in the light-emitting function layer 113 is formed only within the opening 1150 of the pixel defining layer 115.

In some embodiments, as shown in FIG. 2, each sub-pixel 100 further includes a pixel circuit 111. The pixel circuit 111 is electrically connected to a first electrode 112 of a corresponding light-emitting device L and at least one first power line 30 in a sub-display area 20 where the pixel circuit 111 is located. The pixel circuit 111 is configured to drive the corresponding light-emitting device L to emit light. The plurality of second power lines 40 are electrically connected to the second electrodes 114 in all light-emitting devices L.

Figure 4:
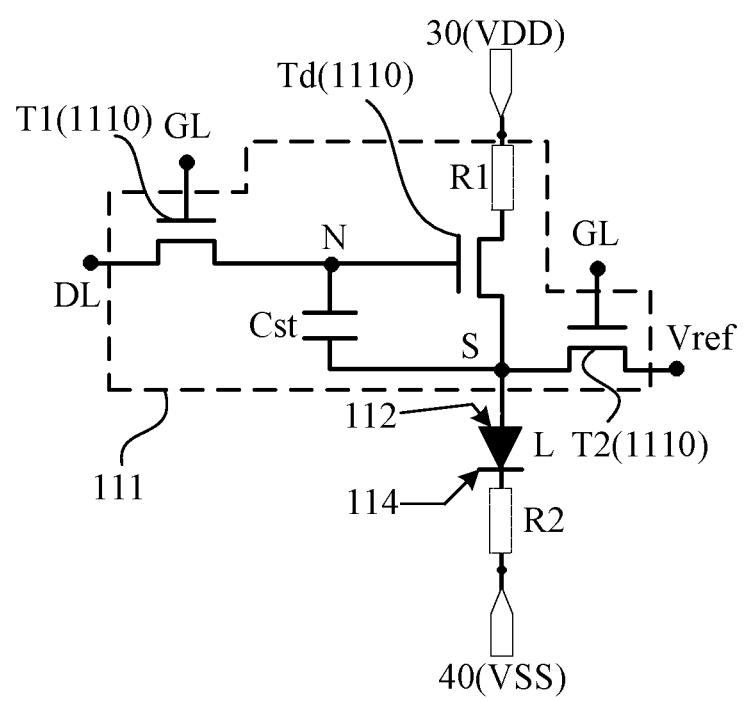
FIG. 4 is an equivalent circuit diagram of a pixel circuit, in accordance with some embodiments of the present disclosure.

In some examples, as shown in FIGS. 2 and 4, the pixel circuit 111 includes a plurality of transistor 1110, and one of the plurality of transistors 1110 is a driving transistor Td. A drain of one of the plurality of transistors 1110 is electrically connected to a first electrode 112 of a corresponding light-emitting device L. Alternatively, it is also possible that a source of the transistor 1110 is electrically connected to the first electrode 112 of the corresponding light-emitting device L. It will be noted that, the transistor 1110 electrically connected to the light-emitting device L may be the driving transistor Td or other transistors, which depends on a circuit structure of the pixel circuit 111.

In some examples, the transistor 1110 is a top-gate thin film transistor. In some other examples, the transistor 1110 is a bottom-gate thin film transistor.

Figure 15A:
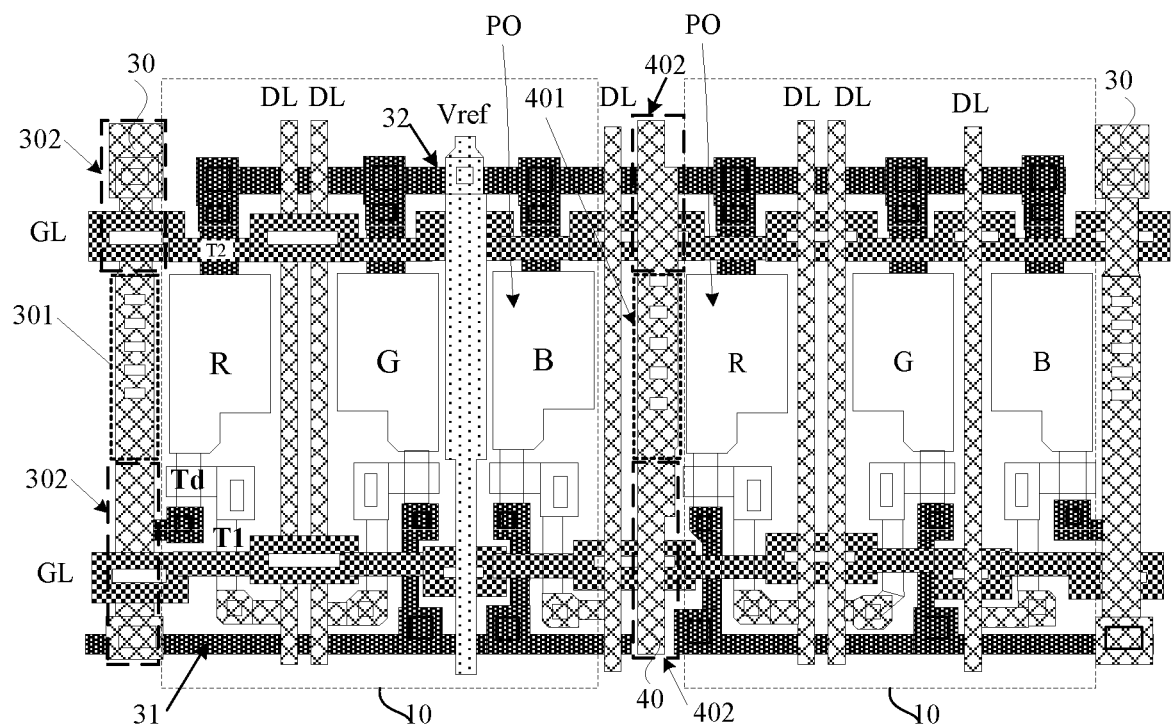
FIG. 15A is a schematic diagram showing a structure of yet another display substrate, in accordance with some embodiments of the present disclosure.
Figure 15B:
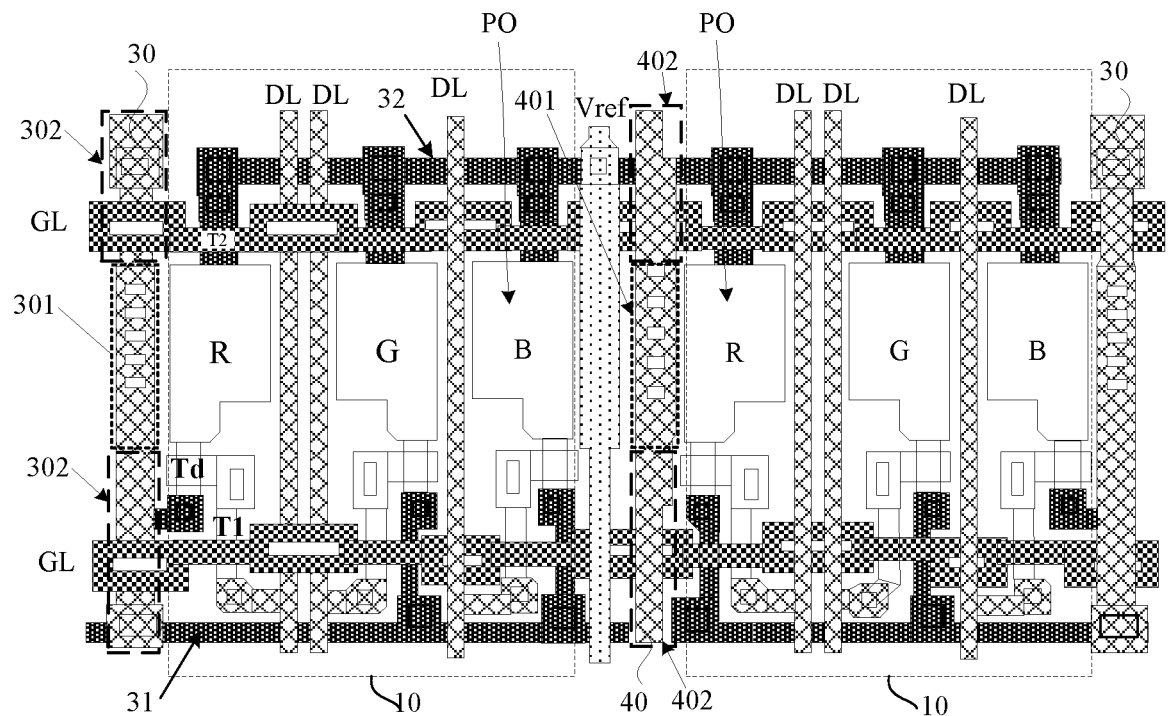
FIG. 15B is a schematic diagram showing a structure of yet another display substrate, in accordance with some embodiments of the present disclosure.

In some embodiments, as shown in FIGS. 15A and 15B, the display substrate 11 further includes a plurality of data lines DL disposed on the base 110, a portion of each of which is located in the display area 01. Pixel circuits 111 in sub-pixels in the same column is electrically connected to a corresponding data line DL. The plurality of data lines DL, the plurality of first power lines 30 and the plurality of second power lines 40 have the same extension direction and are disposed in the same layer.

Since the first power lines 30 and the second power lines 40 are disposed in the same layer as the data lines DL, the first power lines 30, the second power lines 40 and the data lines DL are manufactured synchronously without adding additional process steps, which is beneficial to simplifying the manufacturing process of the display substrate 11.

In some embodiments, as shown in FIGS. 15A and 15B, the display substrate 11 further includes a plurality of gate lines GL disposed on the base 110, a portion of each of which is located in the display area 01. Pixel circuits 111 in sub-pixels in the same row is electrically connected to a corresponding gate line GL.

In some embodiments, as shown in FIGS. 5 to 11, 15A and 15B, all sub-pixels 100 in a sub-display area 20 are electrically connected to a first power line 30 in the sub-display area 20 through first connection lines 31. In some examples, the first connection lines 31 are not disposed in the same layer as the first power lines 30. For example, the first connection lines 31 and light shielding patterns in the display substrate 11 are disposed in the same layer.

In some embodiments, as shown in FIGS. 15A and 15B, the display substrate 11 further includes a plurality of reference voltage lines Vref disposed on the base 110, a portion of each of which is located in the display area 01. A reference voltage line Vref is configured to provide a reference voltage signal to a pixel circuit 111, so as to compensate a threshold voltage of the driving transistor Td shown in FIG. 4. An extension direction of the reference voltage lines Vref may be the same as the extension direction of the data lines DL, and all sub-pixels 100 in the display substrate 11 are electrically connected to the reference voltage lines Vref through second connection lines 32. In some embodiments, the second connection lines 32 are not disposed in the same layer as the reference voltage lines Vref. For example, the second connection lines 32 and the light shielding patterns are disposed in the same layer.

In some embodiments, the first power lines 30 are voltage drain drain (VDD) power lines, and the second power lines 40 are voltage source source (VSS) power lines.

The embodiments of the present disclosure do not limit the circuit structure of the pixel circuit 111 in each sub-pixel 100, and the circuit structure of the pixel circuit 111 may be 2T1C, 3T1C, 6T1C, 7T1C, or the like. Herein, nTmC indicates that one pixel circuit 111 includes n thin film transistors and m capacitors, and both n and m are positive integers. FIG. 4 shows an example in which the pixel circuit 111 has a 3T1C structure. In some embodiments, as shown in FIG. 4, the pixel circuit 111 includes a first transistor T1, a driving transistor Td, a second transistor T2 and a storage capacitor Cst. A gate of the first transistor T1 is electrically connected to a gate line GL, a first electrode of the first transistor T1 is electrically connected to a data line DL, and a second electrode of the first transistor T1 is electrically connected to a node N. A gate of the driving transistor Td is electrically connected to the node N, a first electrode of the driving transistor Td is electrically connected to a first power line 30, and a second electrode of the driving transistor Td is electrically connected to the first electrode 112 of the light-emitting device L. A gate of the second transistor T2 is electrically connected to the gate line GL, a first electrode of the second transistor T2 is electrically connected to a reference voltage line Vref, and a second electrode of the second transistor T2 is electrically connected to the second electrode of the driving transistor Td. One terminal of the storage capacitor Cst is electrically connected to the node N, and the other terminal of the storage capacitor Cst is electrically connected to the second electrode of the driving transistor Td. The second electrode 114 of the light-emitting device L is electrically connected to a second power line 40.

A size of each transistor 1110 in the pixel circuit 111, a size of the storage capacitor Cst, a size of the opening of the pixel defining layer 115, a size of a surrounding parasitic capacitance and the like all affect the light emitted by the sub-pixel 100. In order to avoid an effect of these factors on the light emitted by the sub-pixel 100, for sub-pixels 100 for emitting light of the same color, the size of each transistor 1110 of the pixel circuits may be designed to be the same, the size of storage capacitors Cst may be designed to be the same, and the size of openings 115 of the pixel defining layer may be designed to be the same, and the size of surrounding parasitic capacitances may be designed to be the same when the display substrate 11 is manufactured, it may be ensured that there is no difference among the lights emitted by the sub-pixels 100 for emitting light of the same color.

In some embodiments, as shown in FIG. 2, the display substrate 11 further includes a planarization layer 116 disposed between the pixel circuit 111 and the first electrode 112, and the first electrode 112 is electrically connected to the pixel circuit 111 through a via hole disposed in the planarization layer 116.

In some embodiments, as shown in FIG. 2, the display substrate 11 further includes light shielding pattern(s) 118 and a buffer layer 117 which are sequentially stacked on the base 110 in a thickness direction of the base 110, and a plurality of transistors 1110 are disposed on a side of the buffer layer 117 away from the base 110. In some examples, an orthogonal projection of an active layer of each transistor 1110 on the base 110 is located in a range of an orthogonal projection of a light shielding pattern 118 on the base 110.

In some embodiments, the number of columns of the at least two columns of pixels 10 in each sub-display area 20 is the same. That is, each sub-display area 20 is provided with K columns of pixels 10, where a value of K is an integer greater than or equal to 2 (for example, the value of K is 2, 3, or 4). The number of the first power line(s) 30 provided in each sub-display area 20 is the same.

Since the number of columns of pixels 10 in each sub-display area 20 is the same, and the number of the first power line(s) 30 provided in each sub-display area 20 is the same, it is beneficial to ensure that there is no difference among the lights emitted by sub-display areas 20.

Figure 6:
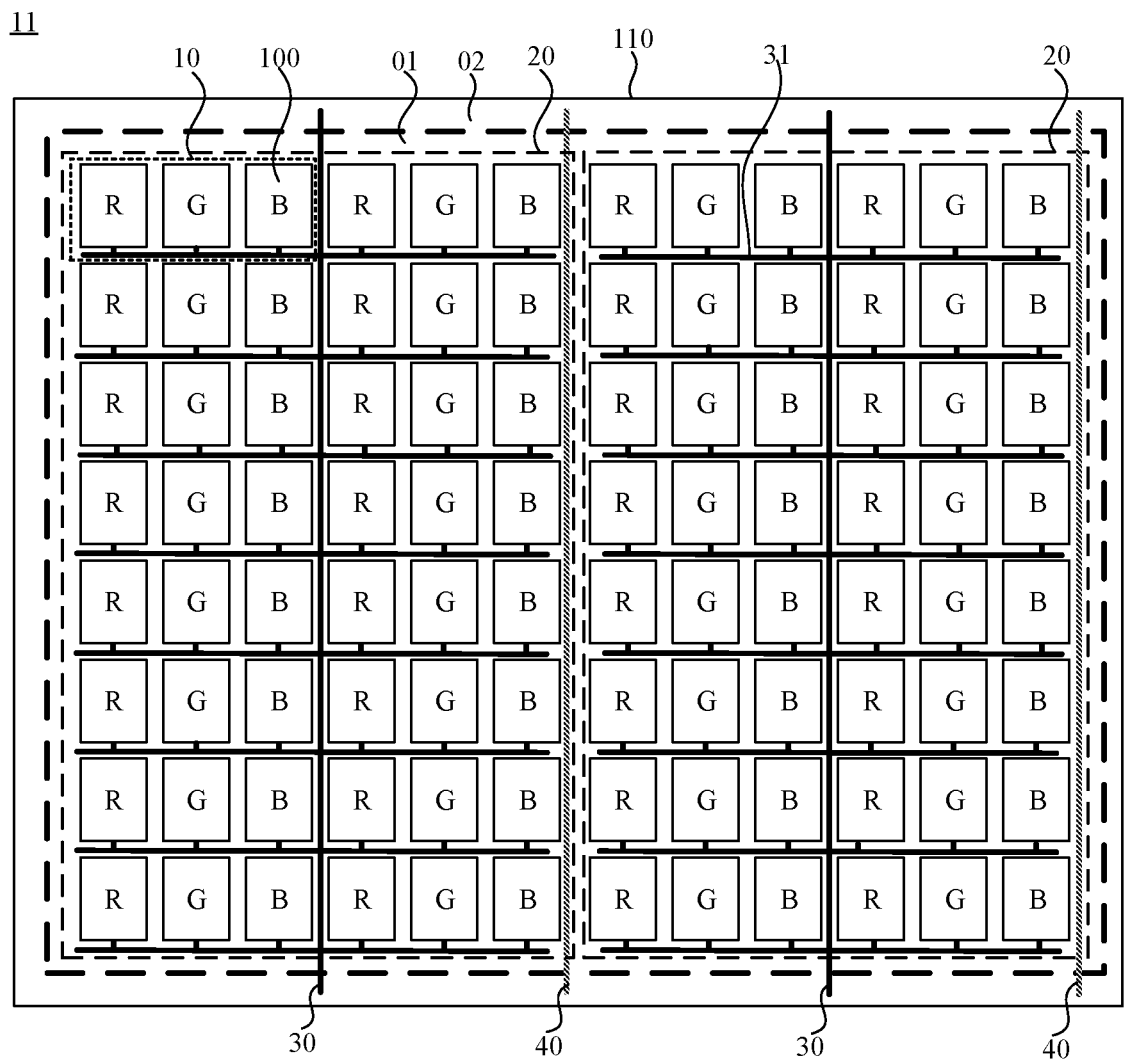
FIG. 6 is a schematic diagram showing a structure of another display substrate, in accordance with some embodiments of the present disclosure.
Figure 7:
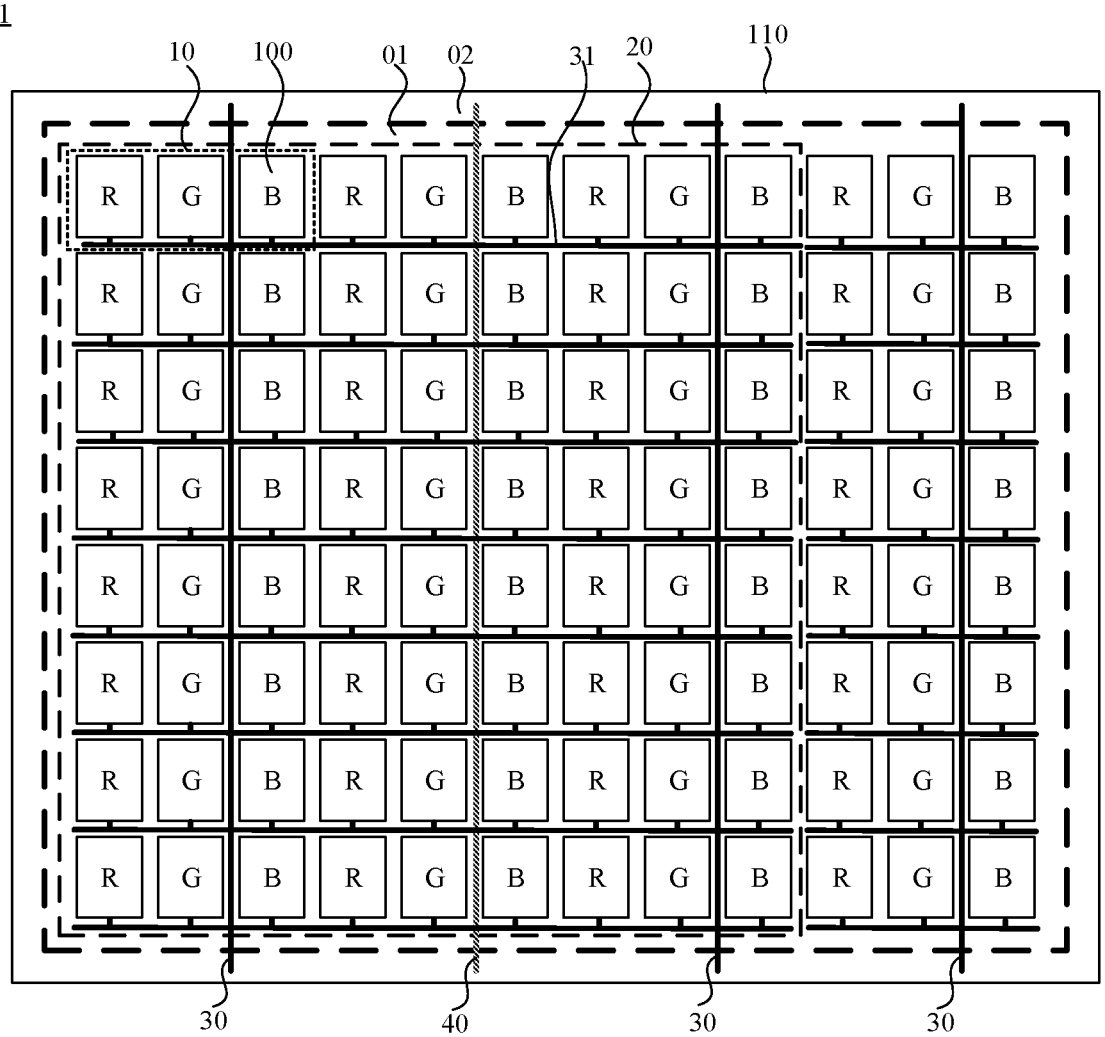
FIG. 7 is a schematic diagram showing a structure of yet another display substrate, in accordance with some embodiments of the present disclosure.
Figure 8:
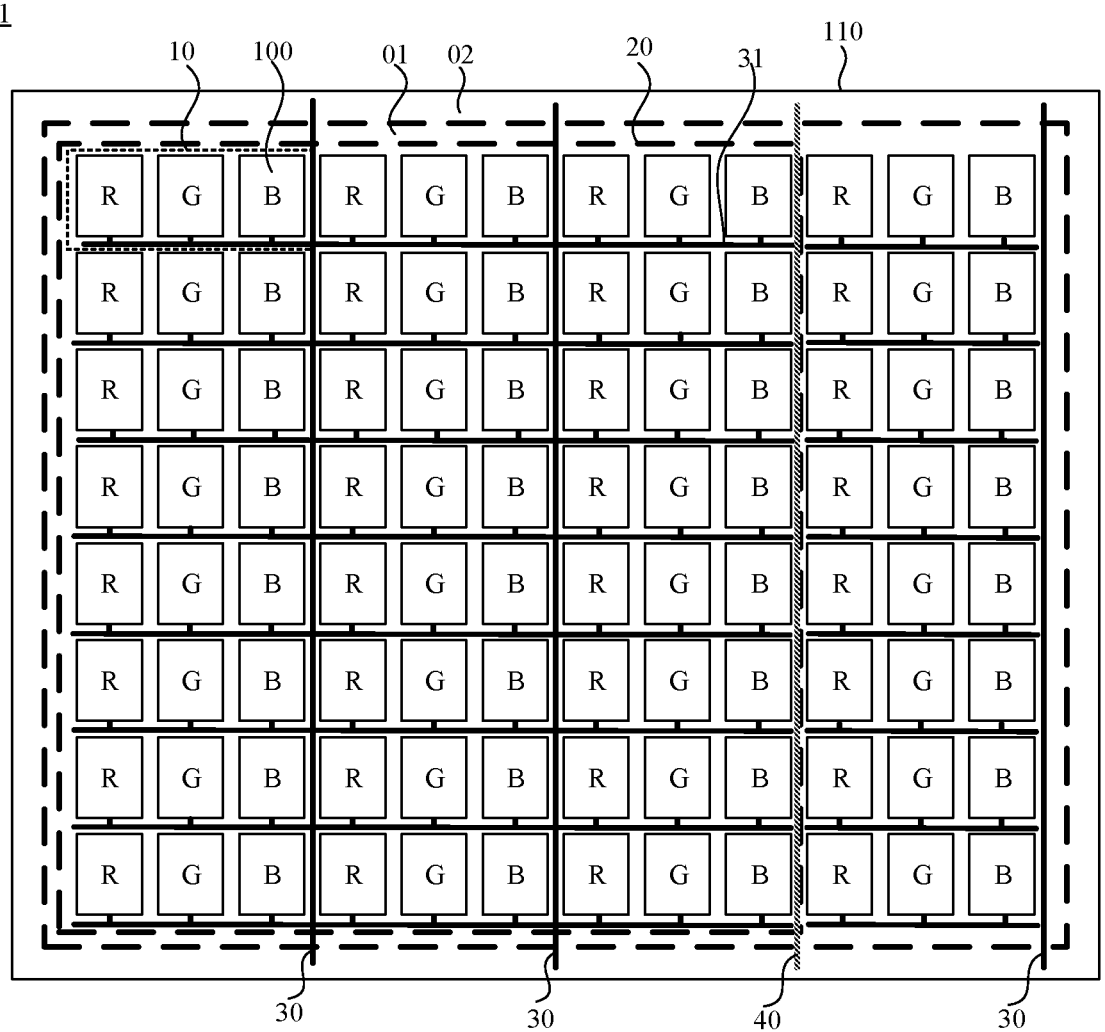
FIG. 8 is a schematic diagram showing a structure of yet another display substrate, in accordance with some embodiments of the present disclosure.
Figure 9:
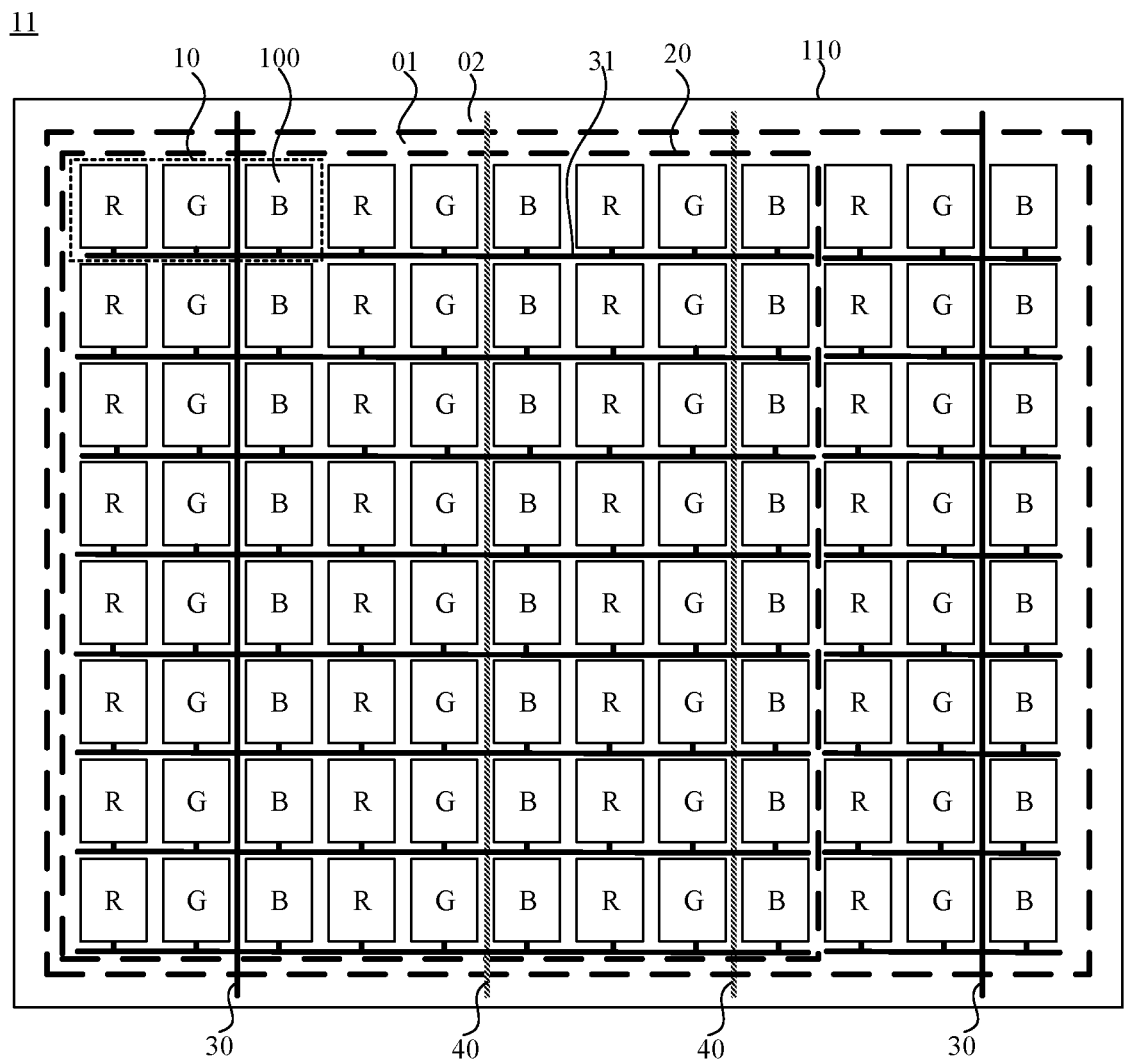
FIG. 9 is a schematic diagram showing a structure of yet another display substrate, in accordance with some embodiments of the present disclosure.
Figure 10:
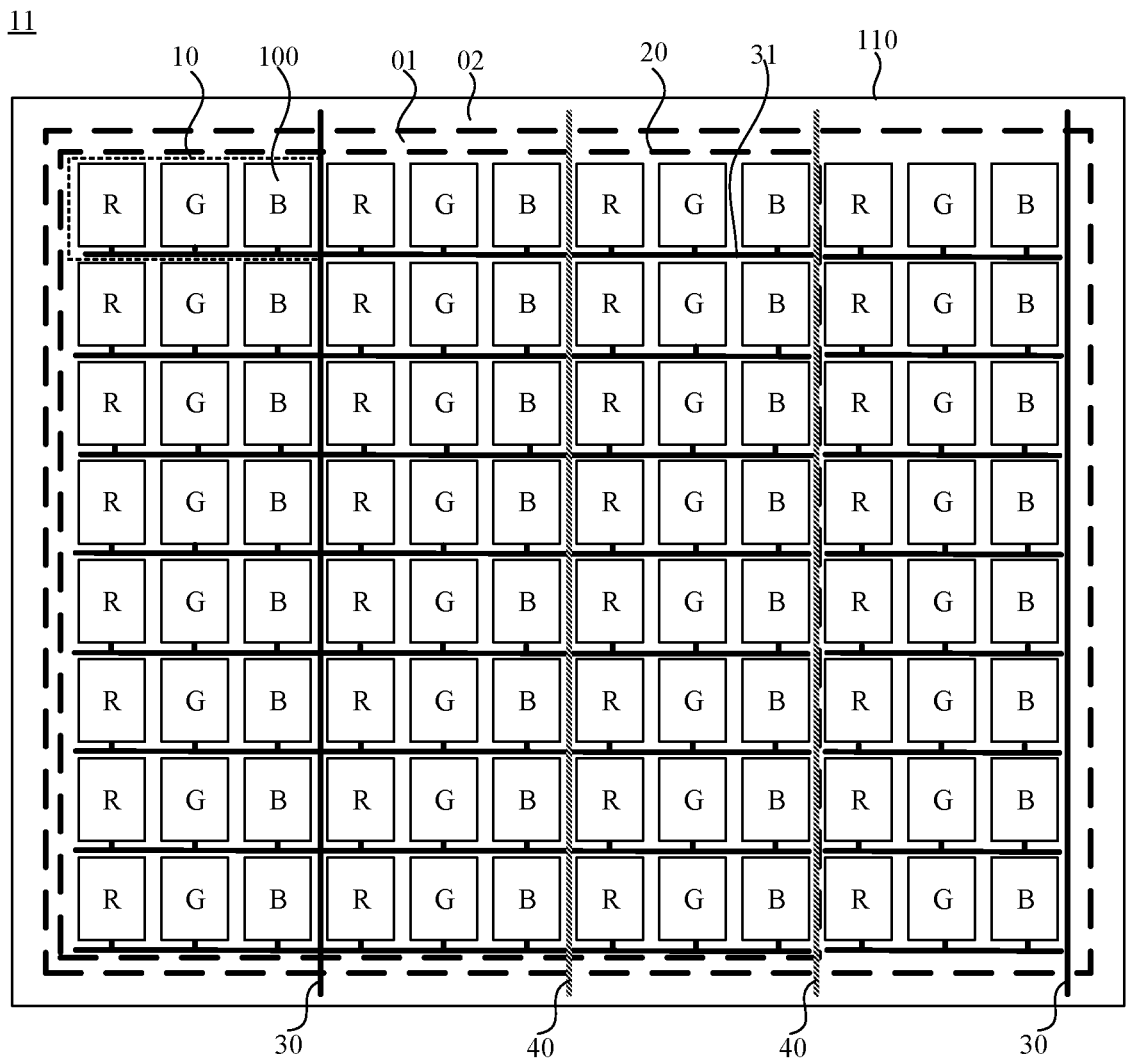
FIG. 10 is a schematic diagram showing a structure of yet another display substrate, in accordance with some embodiments of the present disclosure.
Figure 11:
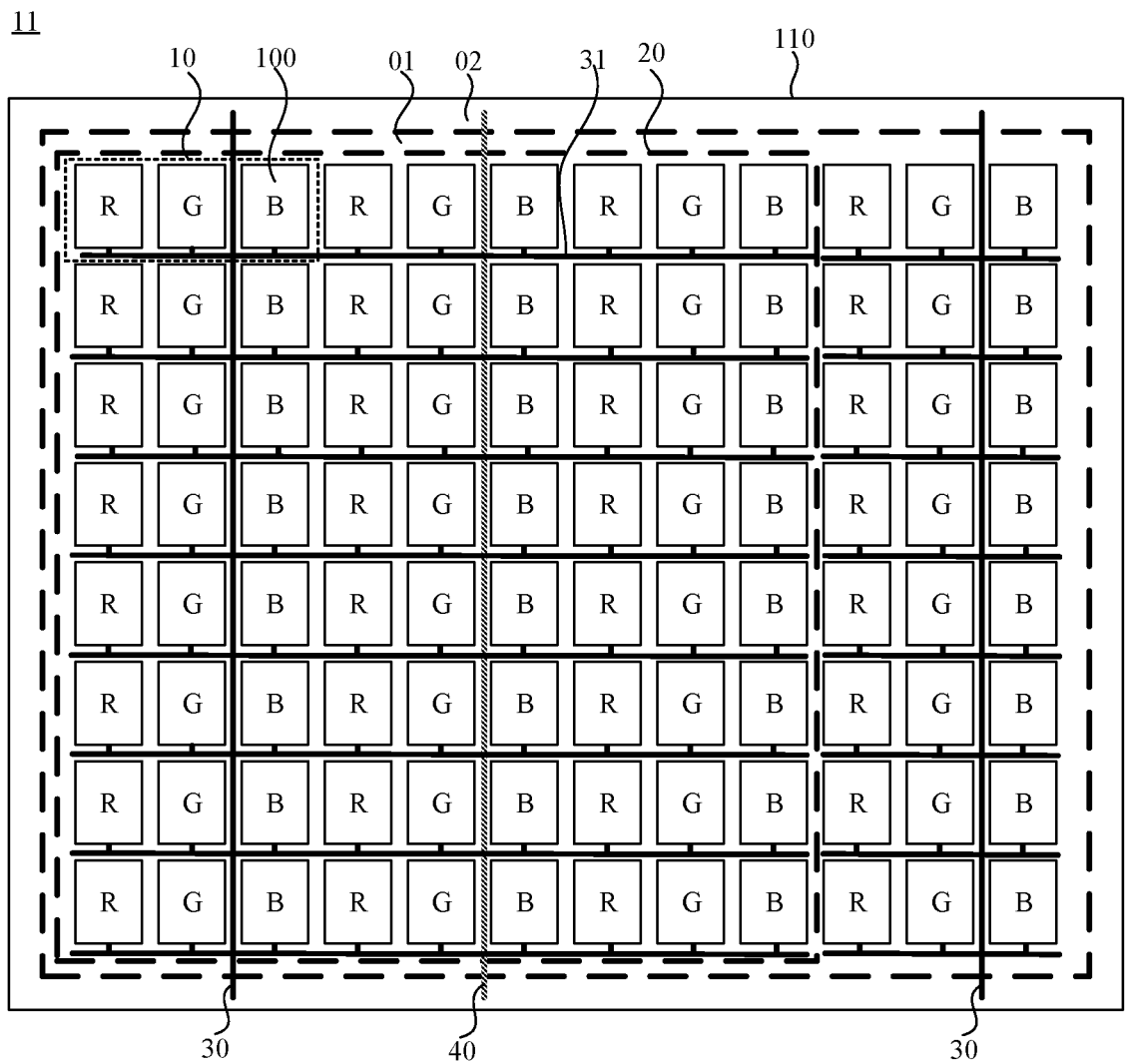
FIG. 11 is a schematic diagram showing a structure of yet another display substrate, in accordance with some embodiments of the present disclosure.

Based on this, in some embodiments, the number of column(s) of pixels 10 between any two adjacent first power lines 30 is the same. In some examples, as shown in FIGS. 5, 7, and 8, one column of pixels 10 is disposed between any two adjacent first power lines 30. In some other examples, as shown in FIGS. 6, 9, and 11, two columns of pixels 10 are disposed between any two adjacent first power lines 30. In yet some other examples, as shown in FIG. 10, three columns of pixels 10 are disposed between any two adjacent first power lines 30.

Since the number of the column(s) of pixels 10 between any two adjacent first power lines 30 is the same, the plurality of first power lines 30 in the display substrate 11 are distributed uniformly, which is beneficial to ensuring that heat generated by each first power line 30 has the same effect on the lights emitted by the sub-pixels 100 located at both sides thereof, and further ensuring the display uniformity of the display panel 1.

In some embodiments, as shown in FIG. 5, each sub-display area 20 is provided with one first power line 30, and the first power line 30 is disposed between two adjacent columns of sub-pixels 100 in a column of pixels 10 in the sub-display area 20. An example is taken in which two columns of pixels 10 are disposed in each sub-display area 20, as shown in FIG. 5, the first power line 30 is disposed between a column of sub-pixels G and a column of sub-pixels B in one column of pixels 10 in the sub-display area 20. In this case, one second power line 40 is disposed between a column of sub-pixels G and a column of sub-pixels B in the other column of pixels 10. Alternatively, the first power line 30 may be disposed between a column of sub-pixels R and a column of sub-pixels G in one column of pixels 10 in the sub-display area 20. In this case, one second power line 40 is disposed between a column of sub-pixels R and a column of sub-pixels G in the other column of pixels 10.

In some other embodiments, as shown in FIG. 6, each sub-display area 20 is provided with one first power line 30, and the first power line 30 is disposed between two adjacent columns of pixels 10 in the sub-display area 20. An example is taken in which two columns of pixels 10 are disposed in each sub-display area 20, as shown in FIG. 6, the first power line 30 is disposed between a column of sub-pixels B in one column of pixels 10 and a column of sub-pixels R in the other column of pixels 10. In this case, one second power line 40 is disposed between a column of sub-pixels B in the other column of pixels 10 and an adjacent column of sub-pixels R in another sub-display area 20.

FIGS. 5 and 6 show examples in which two columns of pixels 10 are provided in each sub-display area 20, and the embodiments of the present disclosure are not limited thereto. The number of columns of pixels 10 provided in the sub-display area 20 may be greater than or equal to 3, that is, three or more columns of pixels 10 may be arranged in the sub-display area 20.

In some examples, as shown in FIGS. 7 to 10, three columns of pixels 10 are disposed in each sub-display area 20.

In some examples, a first power line 30 or a second power line 40 is disposed between any column of sub-pixels 100 for emitting light of the first color and a column of sub-pixels 100 for emitting light of the second color adjacent thereto. In this way, the any column of sub-pixels 100 for emitting light of the first color and the column of sub-pixels 100 for emitting light of the second color adjacent thereto may be made to be uniformly affected by heat generated by the first power supply line 30 or the second power supply line 40 therebetween.

An example is taken in which three columns of pixels 10 are disposed in each sub-display area 20, as shown in FIG. 7, each sub-display area 20 is provided with two first power lines 30. One first power line 30 is disposed between a column of sub-pixels 100 for emitting light of the first color and a column of sub-pixels 100 for emitting light of the second color adjacent thereto in one column of pixels 10 in the sub-display area 20, and the other first power line 30 is disposed between a column of sub-pixels 100 for emitting light of the first color and a column of sub-pixels 100 for emitting light of the second color adjacent thereto in another column of pixels 10 in the sub-display area 20. In this case, in a remaining column of pixels 10 in the sub-display area 20, one second power line 40 is disposed between a column of sub-pixels 100 for emitting light of the first color and a column of sub-pixels 100 for emitting light of the second color adjacent thereto. For example, as shown in FIG. 7, one first power line 30 is disposed between a column of sub-pixels G and a column of sub-pixels B in a first column of pixels 10, the other first power line 30 is disposed between a column of sub-pixels G and a column of sub-pixels B in a third column of pixels 10, and one second power line 40 is disposed between a column of sub-pixels G and a column of sub-pixels B in a second column of pixels 10.

An example is still taken in which three columns of pixels 10 are disposed in each sub-display area 20, as shown in FIG. 8, each sub-display area 20 is provided with two first power lines 30. Each first power line 30 is disposed between a column of sub-pixels 100 for emitting light of the first color in a column of pixels 10 and a column of sub-pixels for emitting light of the second color adjacent thereto in another column of pixels 10 in the sub-display area 20. In this case, For two adjacent sub-display areas 20, one second power line 40 is disposed between a column of sub-pixels 100 for emitting light of the first color, proximate to another sub-display area 20, in one sub-display area 20 and an adjacent sub-pixels 100 for emitting light of the second color located in the another sub-display area 20. For example, as shown in FIG. 8, one first power line 30 is disposed between a column of sub-pixels B in a first column of pixels 10 and a column of sub-pixels R in a second column of pixels 10, the other first power line 30 is disposed between a column of sub-pixels B in the second column of pixels 10 and a column of sub-pixels R in a third column of pixels 10, and one second power line 40 is disposed between a column of sub-pixels B in the third column of pixels 10 and a column of sub-pixels R in a column of pixels 10 adjacent thereto.

An example is still taken in which three columns of pixels 10 are disposed in each sub-display area 20, as shown in FIG. 9, each sub-display area 20 is provided with one first power line 30. The first power line 30 is disposed between a column of sub-pixels 100 for emitting light of the first color and a column of sub-pixels for emitting light of the second color adjacent thereto in one column of pixels 10 in the sub-display area 20. In this case, in each of the other two columns of pixels 10, one second power line 40 is disposed between a column of sub-pixels 100 for emitting light of the first color and a column of sub-pixels 100 for emitting light of the second color adjacent thereto. For example, as shown in FIG. 9, one first power line 30 is disposed between a column of sub-pixels G and a column of sub-pixels B in a first column of pixels 10, one second power line 30 is disposed between a column of sub-pixels G and a column of sub-pixels B in a second column of pixels 10, and the other second power line 40 is disposed between a column of sub-pixels G and a column of sub-pixels B in a third column of pixels 10.

An example is still taken in which three columns of pixels 10 are disposed in each sub-display area 20, as shown in FIG. 10, each sub-display area 20 is provided with one first power line 30. The first power line 30 is disposed between a column of sub-pixels 100 for emitting light of the first color in a column of pixels 10 and a column of sub-pixels for emitting light of the second color adjacent thereto in another column of pixels 10 in the sub-display area 20. In this case, in the sub-display area 20, one second power line 40 is disposed between another column of sub-pixels 100 for emitting light of the first color and a column of sub-pixels 100 for emitting light of the second color adjacent thereto. For two adjacent sub-display areas 20, the other second power line 40 is disposed between a column of sub-pixels 100 for emitting light of the first color, proximate to the other sub-display area 20, in one sub-display area 20 and an adjacent column of sub-pixels 100 for emitting light of the second color located in the other sub-display area 20. For example, as shown in FIG. 10, one first power line 30 is disposed between a column of sub-pixels B in a first column of pixels 10 and an adjacent column of sub-pixels R in a second column of pixels 10, one second power line 40 is disposed between a column of sub-pixels B in the second column of pixels 10 and an adjacent column of sub-pixels R in a third column of pixels 10, and the other second power line 40 is disposed between a column of sub-pixels B in the third column of pixels 10 and an adjacent column of sub-pixels R in another sub-display areas 20.

In some examples, the number of columns of all pixels 10 in the display area 01 is equal to a sum of the number of the plurality of first power lines 30 and the number of the plurality of second power lines 40. That is to say, any power line of the plurality of first power lines 30 and the plurality of second power lines 40 is located between a column of sub-pixels 100 for emitting light of the first color and an adjacent column of sub-pixels 100 for emitting light of the second color.

Alternatively, the number of columns of all pixels 10 in the display area 01 may be greater the sum of the number of the plurality of first power lines 30 and the number of the plurality of second power lines 40. For example, there is a case where neither the first power line 30 nor the second power line 40 is disposed between a certain column of sub-pixels 100 for emitting light of the first color and a column of sub-pixels 100 for emitting light of the second color adjacent thereto. As shown in FIG. 11, in a sub-display areas 20, a first power line 30 is disposed between a column of sub-pixels G and a column of sub-pixels B in a first column of pixels 10, a second power line 30 is disposed between a column of sub-pixels G and a column of sub-pixels B in a second column of pixels 10, and neither first power line 30 nor second power line 40 is disposed between a column of sub-pixels G and a column of sub-pixels B in a third column of pixels 10. That is to say, under a condition of ensuring the display uniformity, the number of the first power lines 30 and/or the second power lines 40 may be appropriately reduced as needed.

It will be noted that, in a case where the sub-display area 20 is provided with two or more first power lines 30, each column of sub-pixels 100 in the sub-display area 20 may be electrically connected to any one or more first power lines 30 disposed in the sub-display area 20.

Considering that if the number of the first power lines 30 is great, the number of ICs that need to be bonded to the display substrate 11 is great. Therefore, in some examples, each sub-display area 20 is provided with one first power line 30. In this way, the number of the first power lines 30 is greatly reduced, so that the number of the ICs that need to be bonded to the display substrate 11 is significantly reduced.

Signals transmitted by the first power lines 30 and the second power lines 40 in the embodiments of the present disclosure are not limited, and need to be set according to a specific structure of the display substrate 11 and display requirements.

In some embodiments, the resistance of the second power line 40 is equal to 0.9 to 1.1 times the resistance of the first power line 30.

In some examples, the resistance of the second power line 40 is equal to the resistance of the first power line 30. In this way, when the display panel 1 displays an image, a magnitude of the current flowing through the first power line 30 and the second power line 40 is the same, so that the heat generated by the second power line 40 is the same as the heat generated by the first power line 30. In this way, the heat generated by the second power line 40 has the same effect on the light emitted by the sub-pixels 100 located at both sides thereof as the heat generated by the first power line 30 has on the light emitted by the sub-pixels 100 located at both sides thereof.

In some other examples, the resistance of the second power line 40 is close to the resistance of the first power line 30. For example, the resistance of the second power line 40 is equal to 0.9 times the resistance of the first power line 30. In this way, when the display panel 1 displays an image, a magnitude of the current flowing through the first power line 30 and the second power line 40 is the same, and the heat generated by the second power line 40 is close to the heat generated by the first power line 30, so that the heat generated by the second power line 40 has substantially the same effect on the light emitted by the sub-pixels 100 located at both sides thereof as the heat generated by the first power line 30 has on the light emitted by the sub-pixels 100 located at both sides thereof.

In some other embodiments, the second electrode 114 of the light-emitting device L is electrically connected to the second power line 40, and a resistance of the second power line 40 and a portion, overlapping with the second power line 40 in a thickness direction of the base 110, of the second electrode 114 of the light-emitting device L after being connected in parallel is equal to 0.9 to 1.1 times the resistance of the first power line 30.

In a case where the second electrode 114 of the light-emitting device L is transparent or translucent, the light emitted by the light-emitting function layer 113 is emitted through the second electrode 114. That is, the light-emitting device L is a top-emission light-emitting device.

In a case where the second electrode 114 is transparent, a material of the second electrode 114 may be indium tin oxide (ITO), indium zinc oxide (IZO), or indium gallium zinc oxide (IGZO), etc. In a case where the second electrode 114 is translucent, the second electrode 114 is a metal electrode with a relatively small thickness (the material is, for example, silver). As a result, a resistance of the second electrode 114 is relatively large, resulting in a relatively large voltage drop (IR drop) on the second electrode 114, in turn resulting in nonuniformity of light emitted by the display panel 1.

Based on this, the second power line 40 is electrically connected to the second electrode 114, which is equivalent to connecting a resistor in parallel to the second electrode 114, so that the resistance of the second electrode 114 may be reduced, and the IR drop may be reduced.

Based on this, referring to FIG. 4, in a case where the first power line 30 is a VDD power line, and the second power line 40 is a VSS power line and is electrically connected to the second electrode 114, a current signal on the VDD power line flows to the VSS power line through the light-emitting device. In the case where the resistance of the second power line 40 and the portion, overlapping with the second power line 40 in the thickness direction of the base 110, of the second electrode 114 of the light-emitting device L after being connected in parallel is equal to 0.9 to 1.1 times the resistance of the first power line 30, it may be considered that the current signal on the VDD power line (i.e., the first power line 30) and a current signal on the VSS power line (i.e., the second power line 40) tend to be the same. Therefore, the effect of the current signal on the first power line 30 on the light emitted by the sub-pixels 100 located at both sides thereof is substantially the same as the effect of the current signal on the second power line 40 on the light emitted by the sub-pixels 100 located at both sides thereof.

In FIG. 4, R1 represents an equivalent resistor of the first power line 30, and R2 represents an equivalent resistor of the second power line 40 and the portion, overlapping with the second power line 40 in the thickness direction of the base 110, of the second electrode 114 after being connected in parallel.

In some examples, a resistance of R2 is equal to a resistance of R1. In this way, the heat generated by the second power line 40 is substantially the same as the heat generated by the first power line 30, so that the effect of the heat generated by the second power line 40 on the light emitted by the sub-pixels 100 located at both sides thereof is substantially the same as the effect of the heat generated by the first power line 30 on the light emitted by the sub-pixels 100 located at both sides thereof.

In some other examples, the resistance of R2 is close to the resistance of R1. For example, the resistance of R2 is equal to 0.9 times the resistance of R1. In this way, the heat generated by the second power line 40 is substantially the same as the heat generated by the first power line 30, so that the effect of the heat generated by the second power line 40 on the light emitted by the sub-pixels 100 located at both sides thereof is substantially the same as the effect of the heat generated by the first power line 30 on the light emitted by the sub-pixels 100 located at both sides thereof.

Figure 14:
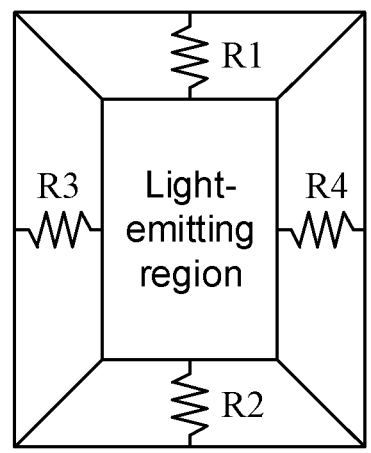
FIG. 14 is a schematic diagram of an equivalent resistor of a second electrode, in accordance with some embodiments of the present disclosure.

In a case where the second electrodes 114 of all light-emitting devices L described above are connected as an integral structure, the second electrodes 114 of all light-emitting devices L constitute a planar electrode. In some examples, the planar electrode is equivalent to four resistors arranged at up, down, left, and right of the planar electrode. As shown in FIG. 14, the second electrode 114 of each sub-pixel 100 may be equivalent to four resistors (R1 to R4) arranged at up, down, left and right, and the resistances of R1, R2, R3 and R4 are calculated by integration. An light-emitting region in the middle of the sub-pixel 100 may be equivalent to a current source (the current source being configured to provide current to the sub-pixel 100).

Figure 16:
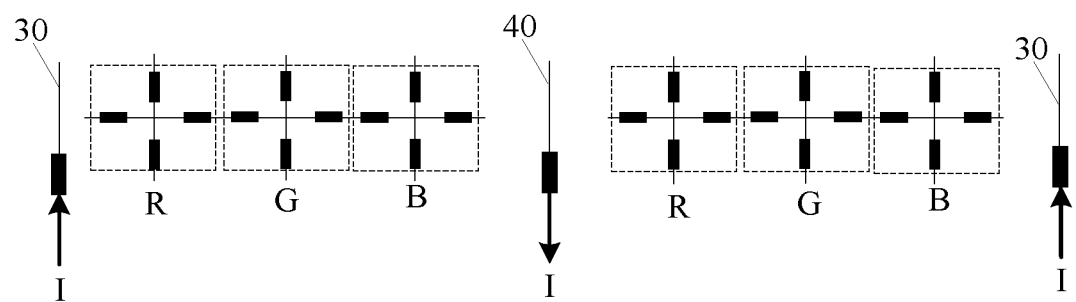
FIG. 16 is a schematic diagram of an equivalent resistor of the display substrate in FIG. 15A or 15B.

FIGS. 15A and 15B are illustrated with two pixels 10 as an example. Each pixel 10 includes a sub-pixel R, a sub-pixel G and a sub-pixel B, and the pixel circuit of each sub-pixel 100 is shown in FIG. 4. A schematic diagram of an equivalent resistor of the structure of the display substrate 11 shown in FIGS. 15A and 15B is shown in FIG. 16. The second electrode 114 of each sub-pixel 100 may be equivalent to four resistors arranged at up, down, left and right, a first power line 30 is equivalent to a resistor, and a second power line 40 is equivalent to a resistor.

The current mainly flows through the first power line 30, the second power line 40, and the portion, overlapping with the second power line 40 in the thickness direction of the base 110, of the second electrode 114. The resistance of R1 (i.e., the first power line 30) is equal to the resistance of R2 of an equivalent resistor $R_{aux}$ of the second power line 40 and an equivalent resistor $R_{cathode}$ of the portion, overlapping with the second power line 40 in the thickness direction of the base 110, of the second electrode 114 after being connected in parallel, that is, $R1=R2=R_{aux}//R_{cathode}$, "//" represents parallel connection.

According to that $R1=R2=R_{aux}//R_{cathode}$, a relationship of the resistance of R1 (i.e., the first power line 30) and the resistance of $R_{aux}$ (i.e., the second power line 40) is: $R1=K \times R_{aux}$, K is related to the material and thickness of the second power line 40, and K is greater than 1.

In some embodiments, a line width of the first power line 30 is greater than a line width of the second power line 40.

In a case where the resistance of the second power line 40 and the portion, overlapping with the second power line 40 in the thickness direction of the base 110, of the second electrode 114 after being connected in parallel is equal to the resistance of the first power line 30, it may be known that the resistance of the second power line 40 is greater than the resistance of the first power line 30. Therefore, the line width of the first power line 30 is set to be greater than the line width of the second power line 40. In this way, in a case where the material of the first power line 30 and the material of the second power line 40 are the same, and the thicknesses of the two are the same, it may be ensured that the resistance of the second power line 40 is greater than the resistance of the first power line 30.

In some other embodiments, the line width of the first power line 30 is equal to the line width of the second power line 40.

Since the resistance of the second electrode 114 is relatively large, the resistance of the second power line 40 and the portion, overlapping with the second power line 40 in the thickness direction of the base 110, of the second electrode 114 after being connected in parallel is close to the resistance of the second power line 30. Therefore, in some embodiments, the resistance of the portion, overlapping with the second power line 40 in the thickness direction of the base 110, of the second electrode 114 may be ignored. In this way, when designing the display substrate 11, only the resistance of the second power line 40 needs to be considered. In some examples, the resistance of the second power line 40 is set to be equal to the resistance of the first power line 30. In this way, in a case where the material of the first power line 30 and the material of the second power line 40 are the same, it is ensured that the resistance of the second power line 40 is equal to the resistance of the first power line 30 only by setting the line width of the first power line 30 to be equal to the line width of the second power line 40.

It will be noted that, in addition to the first power lines 30 and the second power lines 40, the display substrate 11 is provided with other wires, such as the gate lines GL and the data lines DL. In order to provide space for other wires, there is a difference between line widths of different portions of the first power line 30 in the extension direction of the first power line 30. That is, a line width of a certain portion of the first power line 30 is large, and a line width of another certain portion thereof is small. Similarly, a line width of a certain portion of the second power line 40 is large, and a line width of another certain portion is small.

In the display substrate 11 provided by some embodiments of the present disclosure, the line width of the first power line 30 refers to an average value of line widths of different portions of the first power line 30, and the line width of the second power line 40 refers to an average value of line widths of different portions of the second power line 40.

In a case where the first power line 30 and the second power line 40 are arranged in the same layer, and the line width of the first power line 30 is greater than the line width of the second power line 40, the embodiments of the present disclosure do not limit a difference between the line width of the first power line 30 and the line width of the second power line 40, and the line width of the first power line 30 and the line width of the second power line 40 may be designed according to a difference between the resistance of the first power line 30 and the resistance of the second power line 40, so that the resistance of the first power line 30 is approximately equal to the resistance of the second power line 40 and the portion, overlapping with the second power line 40 in the thickness direction of the base 110, of the second electrode 114 after being connected in parallel.

In some embodiments, as shown in FIGS. 15A and 15B, the first power line 30 includes first portions 301 and second portions 302, and the second power line 40 includes third portions 401 and fourth portions 402. A first portion 301 and a third portion 401 are each located between pixel openings PO of two adjacent sub-pixels 100. A difference between a line width of the first portion 301 and a line width of the third portion 401 is in a range of 0 μm to 1 μm.

Herein, a pixel opening of a sub-pixel 100 refers to an effective light-emitting region of the sub-pixel 100.

In some examples, the line width of the first portion 301 and the second portion 302 of the first power line 30 are different, and the line width of the third portion 401 and the fourth portion 402 of the second power line 40 are different. For example, the line width of the first portion 301 is less than the line width of the second portion 302.

In some examples, the difference between the line width of the first portion 301 and the line width of the third portion 401 is 0 µm, 0.5 µm, 0.8 µm, 1 µm, or the like.

The foregoing descriptions are merely specific implementation manners of the present disclosure, but the protection scope of the present disclosure is not limited thereto. Changes or replacements that any person skilled in the art can easily conceive of within the technical scope of the present disclosure shall all be included in the protection scope of the present disclosure. Therefore, the protection scope of the present disclosure shall be subject to the protection scope of the claims.

What is claimed is:

1. A display substrate having an display area, the display area including a plurality of sub-display areas; the display substrate comprising:
   a base;
   a plurality of columns of pixels disposed on the base and located in the display area, at least two columns of pixels in the plurality of columns of pixels being disposed in each sub-display area, and each column of pixels including at least three columns of sub-pixels;
   a plurality of first power lines disposed on the base, each sub-display area being provided with at least one first power line of the plurality of first power lines, the at least one first power line being configured to provide a first power signal to all sub-pixels in the sub-display area where the at least one first power line is located; and
   a plurality of second power lines disposed on the base, extension directions of the plurality of second power lines and the plurality of first power lines being the same as an arrangement direction of a plurality of sub-pixels in a column of sub-pixels; the plurality of second power lines being configured to provide a second power signal to all sub-pixels located in the display area; wherein
   a plurality of columns of sub-pixels are disposed between any two adjacent power lines among the plurality of first power lines and the plurality of second power lines, and any first power line and any second power line are each arranged between a column of sub-pixels for emitting light of a first color and a column of sub-pixels for emitting light of a second color adjacent thereto.

2. The display substrate according to claim 1, wherein each sub-display area is provided with one first power line.

3. The display substrate according to claim 1, wherein any column of sub-pixels for emitting light of the first color and a column of sub-pixels 100 for emitting light of the second color adjacent thereto are provided with one first power line or one second power line therebetween.

4. The display substrate according to claim 1, wherein a number of columns of the at least two columns of pixels in each display sub-area is the same.

5. The display substrate according to claim 1, wherein a number of columns of pixels between any two adjacent first power lines is the same.

6. The display substrate according to claim 1, wherein the plurality of first power lines and the plurality of second power lines are disposed in the same layer.

7. The display substrate according to claim 1, wherein each sub-pixel includes a light-emitting device, the light-emitting device includes a first electrode, a light-emitting functional layer and a second electrode that are sequentially stacked in a thickness direction of the base, the second electrode is electrically connected to at least one second power line.

8. The display substrate according to claim 7, wherein second electrodes of light-emitting devices of all sub-pixels are connected as an integral structure;
   the plurality of second power lines are all electrically connected to the integral structure.

9. The display substrate according to claim 7, wherein each sub-pixel further includes a pixel circuit, the pixel circuit is electrically connected to the first electrode of the light-emitting device in the sub-pixel and at least one first power line in a sub-display area where the pixel circuit is located, the pixel circuit is configured to drive the corresponding light-emitting device to emit light.

10. The display substrate according to claim 9, further comprising:
    a plurality of data lines disposed on the base and located in the display area, pixel circuits located in the same column of sub-pixels are connected to a corresponding data line; wherein
    the plurality of data lines, the plurality of first power lines and the plurality of second power lines have the same extension direction and are disposed in the same layer.

11. The display substrate according to claim 1, wherein a resistance of the first power line is equal to 0.9 to 1.1 times a resistance of the second power line.

12. The display substrate according to claim 7, wherein a resistance of the second power line and a portion, overlapping with the second power line in the thickness direction of the base, of the second electrode after being connected in parallel is equal to 0.9 to 1.1 times a resistance of the first power line.

13. The display substrate according to claim 6, wherein a line width of the first power line is greater than or equal to a line width of the second power line.

14. The display substrate according to claim 13, wherein the first power line includes a first portion and a second portion, the second power line includes a third portion and a fourth portion, the first portion and the third portion are each located between pixel openings of two adjacent sub-pixels, and a difference between a line width of the first portion and a line width of the third portion is in a range of 0 µm to 1 µm.

15. The display substrate according to claim 1, wherein the first power line is a voltage drain drain (VDD) power line, and the second power line is a voltage source source (VSS) power line.

16. The display substrate according to claim 1, wherein each column of pixels includes a column of sub-pixels for emitting red light, a column of sub-pixels for emitting green light, and a column of sub-pixels for emitting blue light;
    the light of the first color and the light of the second color are two of the red light, the green light and the blue light.

17. The display substrate according to claim 1, wherein each column of pixels includes a column of sub-pixels for emitting red light, a column of sub-pixels for emitting green light, a column of sub-pixels for emitting blue light, and a column of sub-pixels for emitting white light;
    the light of the first color and the light of the second color are two of the red light, the green light, the blue light and the white light.

18. A display apparatus, comprising the display substrate according to claim 1.

* * * * *